(12) United States Patent
Nishikawa et al.

(10) Patent No.: US 7,251,717 B2
(45) Date of Patent: Jul. 31, 2007

(54) SEMICONDUCTOR MEMORY DEVICE

(75) Inventors: Kazuyo Nishikawa, Osaka (JP); Motonobu Nishimura, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 351 days.

(21) Appl. No.: 10/863,328

(22) Filed: Jun. 9, 2004

(65) Prior Publication Data
US 2004/0255092 A1 Dec. 16, 2004

(30) Foreign Application Priority Data
Jun. 10, 2003 (JP) ............ P.2003-165498

(51) Int. Cl.
*G06F 12/00* (2006.01)
(52) U.S. Cl. ............ 711/173; 711/170
(58) Field of Classification Search ............ None
See application file for complete search history.

(56) References Cited

U.S. PATENT DOCUMENTS 4,488,256 A * 12/1984 Zolnowsky et al. ........ 711/210
5,396,619 A * 3/1995 Walton ............ 714/8
6,070,205 A * 5/2000 Kato et al. ............ 710/100
6,128,509 A * 10/2000 Veijola et al. ............ 455/556.1

FOREIGN PATENT DOCUMENTS

JP 61-008798 1/1986
JP 4-11957 3/1992

OTHER PUBLICATIONS

Ito, Kiyoo, "Advanced Electronics I-9 VLSI memory," No. 6 print in first version published by Baifukuakn, pp. 23-24 (w/English Translation).

* cited by examiner

*Primary Examiner*—T Nguyen
(74) *Attorney, Agent, or Firm*—McDermott Will & Emery LLP

(57) ABSTRACT

While a plurality of physical address memories are provided with respect to one logical address of a non-volatile memory device, an empty physical address memory contained in the plural physical address memories is searched with respect to a writing operation for one logical address, and then, data is written in this empty physical address memory. With respect to a reading operation for one logical address, such a physical address memory to which data has been written at last is searched, and the storage content of this memory is read out. As a result, the data rewriting operation to a non-volatile memory can be carried out with employment of the simple circuit arrangement with respect to one logical address, while an erasing operation is not performed, and an area of a memory device is not increased but also a total number of data rewriting operation is not limited to a number defined in a specification of the memory device.

2 Claims, 17 Drawing Sheets

SEMICONDUCTOR MEMORY DEVICE

The present application is based on Japanese Patent Application No. 2003-165498, which is incorporated herein by reference.

BACKGROUND OF THE INVENTION

1. Field of the Invention

The present invention is related to a semiconductor memory device on which an electrically writable non-volatile memory is mounted.

2. Description of the Related Art

Conventionally, non-volatile memories have been necessarily employed as memories for storing thereinto system control programs, and memories used to store thereinto either parameters or data. Among these non-volatile memories, such memories which can be manufactured in the lowest cost are mask ROMs. However, data must be previously and physically formed in such mask ROMs in manufacturing steps of semiconductor memory devices, and thus, delivery appointed dates from definitions of ROM data up to product shipment become longer.

On the other hand, EPROMs are electrically-writable and ultraviolet-erasable memories. Since arbitrary values can be written at arbitrary addresses only one time, short appointed dates of delivery can be realized after ROM data has been defined. Also, all memory areas of such an EPROM can be erased by utilizing ultraviolet rays. However, when EPROMs are assembled in packages made of materials through which ultraviolet rays can not penetrate, ROM data may be merely written in EPROM, but cannot be erased.

Under such a circumstance, electrically writable/erasable programmable read-only memories (EEPROMs) have been recently used as major semiconductor memory devices. In memories which are writable/erasable in the unit of a word among EEPROMs, memory cell arrays must be subdivided every erase unit, areas of these memories are increased and these memories are not properly manufactured with large storage capacities in view of manufacturing cost thereof. Therefore, flash EEPROMs are presently utilized in many fields, since these flash EEPROMs are writable in the word unit and predetermined regions thereof are erased in a batch manner.

Since other EPROMs or flash EEPROMs are employed, short appointed delivery dates can be realized, and moreover, these memories may be employed so as to adjust production in the case that ROM data are required to be changed, depending upon shipping destinations. As a consequence, either EPROMs or flash EEPROMs have been mounted in most of the electronic appliances.

However, there are other memory utilities such as EEPROMs, namely rewriting operations are required plural times in the word unit. There are many possibilities that EEPROMs are mounted on systems in combination with either EPROMs or flash EEPROMs. For instance, this EEPROM is used in order to store there into an individual serial number, or an individual security code.

Data must be rewritten in a small unit, for instance, a serial number must be rewritten every time the present user is replaced by a new user, and a security code is rewritten in a periodic manner so as to increase a security level. In the case that EEPROMs are employed in such a memory utility, there are many opposites that necessary storage capacities of these EEPROMs are very small, for example, a flash EEPROM requires 8 Mbits, and an EEPROM requires 512 bits. When both a flash EEPROM and an EEPROM are mounted on the same chip, a substrate of a memory cell must be subdivided in order that this EEPROM can be individually erased in a small unit irrespective of the flash EEPROM. Both the EEPROM and flash EEPROM memories cannot be arranged within the same memory cell array, so that an area of a memory device is increased (refer to, for example, "Advanced Electronics I-9 VLSI memory" written by ITO Kiyoo, pages 23 to 24, No. 6 print in first version published by BAIFUKAN, Feb. 20, 2000.).

Under such a circumstance, there are some cases that the above-explained erasing operation may be realized by a computer program capable of controlling a flash EEPROM without mounting such an EEPROM. FIG. 18 indicates a process flow operation as to this computer program. In this process flow operation, a relevant erase block is firstly calculated from a rewriting address (step 131), and then, all of data of the erase block where the data which should be rewritten are present are stored in a RAM, or the like (step 132). An erasing operation of the above-described erase block is executed (step 133), and the data which have been stored in the RAM and correspond to the data to be rewritten are rewritten (step 134). Then, all of the data stored in the RAM are again written into the flash EEPROM (step 135). As a result, the rewriting operation can be carried out in the arbitrary word unit.

As previously explained, when the flash EEPROM and the EEPROM having the small storage capacity are mounted at the same time, if these flash EEPROM and EEPROM are mounted on the same chip in the mixing manner, then there is such a problem that the area of the memory device is increased. Also, in the case that the EEPROM having the small storage capacity is realized by the program control, lengthy time is required in the rewriting operation, and the erasing operation is required every time the rewriting operation is carried out. In a flash EEPROM whose rewriting time is limited, the following problem occurs. That is, the writing times of the region which is employed as the EEPROM are restricted to such value smaller than, or equal to the rewriting times of the flash EEPROM.

SUMMARY OF THE INVENTION

The present invention has been made to solve the above-explained conventional problems, and therefore, has an object to provide a rewritable semiconductor memory device having a simple circuit arrangement, while an area of the semiconductor memory device is not increased, but also, a total rewriting time is not limited to be smaller than, or equal to the total rewriting time defined in a technical specification thereof.

To solve the above-described problems, a semiconductor memory device, according to first invention, is featured by such a semiconductor memory device comprising: memory means for allocating a plurality of physical address memories with respect to one logical address; write destination selecting means for selecting an empty physical address memory among the plurality of physical address memories; and write means for writing data into the selected empty physical address memory.

In accordance with the above-described first invention, when the content stored at one logical address is rewritten, if the data is written into the empty physical address memory within the plural physical address memories provided in correspondence thereto, then the rewriting operation of the data can be carried out, while the erasing process operation is not carried out, and the specific writing limitation is provided.

A semiconductor memory device, according to second invention, is featured by further comprising: read destination selecting means for selecting a physical address memory into which the data has been written at last among the plurality of physical address memories; and reading means for reading the data from the selected physical address memory into which the data has been written at last.

In accordance with the above-described second invention, since the erasing process operation is not carried out, there are some possibilities that the data have been written in the plural physical address memories corresponding to one logical address. However, since the data which has been written at last corresponds to the latest effective data, the data is read from such a physical address memory into which the data has been written at last, so that the finally-written effective data can be read out even when the erasing process operation is not performed.

A semiconductor memory device, according to third invention, is featured by memory means for allocating a plurality of physical address memories and a plurality of address identification data areas with respect to one logical address; write destination selecting means for selecting an empty physical address memory among the plurality of physical address memories based upon address identification data of the address identification data areas; and writing means for writing data into the selected empty physical address memory.

In accordance with the above-described third invention, when the content stored at one logical address is rewritten, the empty physical address memory is selected form the plural physical address memories based upon the address identification data of the address identification data areas which are provided in correspondence thereto. If the data is written into this empty physical address memory, then the data rewriting operation can be carried out while the erasing process operation is not carried out, but also, the specific writing limitation is not provided.

A semiconductor memory device, according to fourth invention, is featured by further comprising; read destination selecting means for selecting a physical address memory into which the data has been written at last among the plurality of physical address memories based upon the address identification data of the address identification data areas; and reading means for reading the data from the selected physical address memory into which the data has been written at last.

In accordance with the above-described fourth invention, since the erasing process operation is not carried out, there are some possibilities that the data have been written in the plural physical address memories corresponding to one logical address. However, since the data which has been written at last corresponds to the latest effective data, the physical address memory into which the data has been written at last is selected based upon the address identification data of the address identification data areas, and then, the data is read from this physical address memory, so that the finally-written effective data can be read out even when the erasing process operation is not performed.

A semiconductor memory device, according to fifth invention, is featured by that the write destination selecting means designates the address identification data areas provided in correspondence with the physical addresses with the one logical address in the address order so as to read address identification data, and selects a physical address to be accessed based upon the read result.

In accordance with the above-described fifth invention, since the address identification data areas provided at one logical address are designated in the address order so as to select the empty physical address memory, the physical address memories into the data have been written can be set in the physical address order.

A semiconductor memory device, according to sixth invention, is featured by that the read destination selecting means designates the address identification data areas provided in correspondence with the physical addresses with the one logical address in the address order so as to read address identification data, and selects an empty physical address memory based upon the read result, and also, selects physical address memory having an address preceding to the selected empty physical address memory by 1 as the physical address memory into which the data has been written at last.

In accordance with the above-described sixth invention, in the case that the physical address memories into which the data are written are set in the physical address order, when the address identification data of the address identification data areas are read in the address order and thus the empty physical address memory is found out, the data has been stored in such a physical address memory of the address preceding to the address of this empty physical address memory, and moreover the data which is presently stored in this physical address memory corresponds to effective data which has been written at last and should be read.

A semiconductor memory device, according to seventh invention, is featured by that a partial area of each of the physical address memories provided with respect to the one logical address is set to the address identification data area.

In accordance with the above-explained seventh invention, since a partial area of the plural physical address memories is equal to the address identification data area, another physical address memory need not be prepared in order to secure the address identification data area, but also the area of the semiconductor memory device is not made large.

A semiconductor memory device, according to eighth invention, is featured by that the address identification data area is set in correspondence with a physical address to another physical address memory irrespective of the plurality of physical address memories with respect to the one logical address.

In accordance with the above-described eighth invention, since the address identification data area is not set to the physical address memory for writing thereinto the data, the regrettable area can be provided without changing the word length.

A semiconductor memory device, according to ninth invention, is featured by that a plurality of address identification data areas with respect to the one logical address are set to other memory areas than the plurality of physical address memories every physical address with respect to 1 bit.

In accordance with the above-described ninth invention, since the address identification data can be made by 1 bit, dthe address identification data area is decreased, so that the rewritable area can be provided while the waste area is not formed.

A semiconductor memory device, according to tenth invention, is featured by that each of 1-bit address identification data which have been set to the other memory areas is read to a volatile memory so as to be employed.

In accordance with the above-described tenth invention, since each of the address identification data is 1 bit, this address identification data can be readily read in such a volatile memory as a register and can be stored thereinto.

Subsequently, since this volatile memory is accessed in a high speed, the address identification data can be employed. As a consequence, both the data writing speed and the data reading speed can be improved with respect to the memory means.

A semiconductor memory device, according to eleventh invention, is featured by that a plurality of physical address with respect to one logical address which constitute the memory means are arranged at a plurality of different rewritable non-volatile memory erase blocks; and the semiconductor memory device is further comprised of: control means operated in such a manner that when writing operations by the writing means are accomplished with respect to all of the plurality of physical address memories within a first erase block, a writing operation by the writing means is carried out with respect to the plurality of physical address memories within the erase block, during which the first erase block is erased.

In accordance with the above-described eleventh invention, since the plural physical address memories with respect to one logical address are arranged in at least two erase blocks of the rewritable non-volatile memory (flash EEPROM etc.), when the data are written into all of the plural physical address memories within the first erase block, the data are subsequently written into the plural physical address memories within the second erase block, during which the written data of the first erase block are reerased. As a consequence, when the data are subsequently written into all of the plural physical address memories within the second erase block, the data can be written into the plural physical address memories within the first erase block, so that a total data rewriting time with respect to one logical address can be largely increased.

DETAILED DESCRIPTION OF THE PREFERRED EMBODIMENTS

First Embodiment

Figure 1:
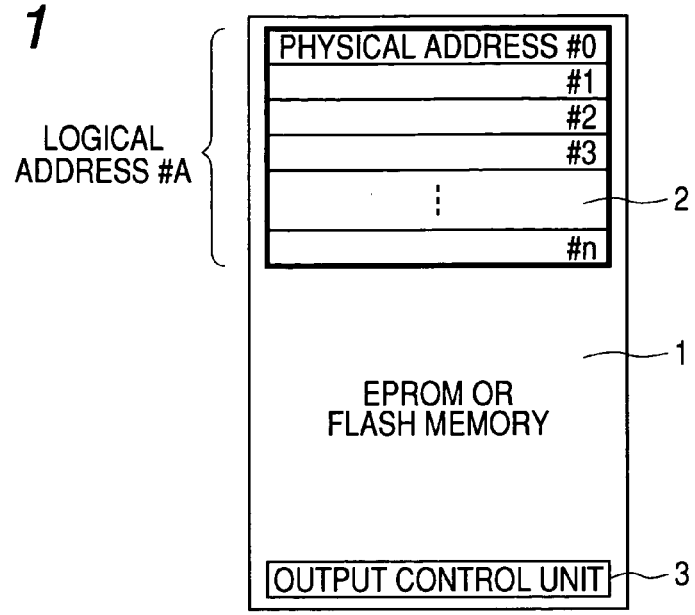
FIG. 1 is a schematic diagram for indicating a structure of a semiconductor memory device according to a first embodiment of the present invention.

Referring now to drawings, an embodiment of the present invention will be described. FIG. 1 is a schematic diagram for showing a structure of a semiconductor memory device according to a first embodiment of the present invention. Reference numeral 1 shows a non-volatile memory device (either EPROM or flash EEPROM), reference numeral 2 indicates a non-volatile memory corresponding to an aggregated member made of a plurality of physical address memories #0, #1, - - - #n, and reference numeral 3 represents an output control unit for controlling outputs of memory data. #0, #1, - - - #n are also used for the meaning of the physical addresses.

In this case, the non-volatile memory 2 is allocated to a logical address #A. Also, an initial state of the aggregated member of all physical address memories within the non-volatile memory 2 is an erase state (data "1"). It is so assumed that as data to be stored in the non-volatile memory 2, data other than "FF" such as a security code are always stored. It should be understood that in this embodiment, after the non-volatile memory has been erased, a data storage state is explained as data "1", whereas after the non-volatile memory has been written, a data storage state is explained as data "0."

Figure 2:
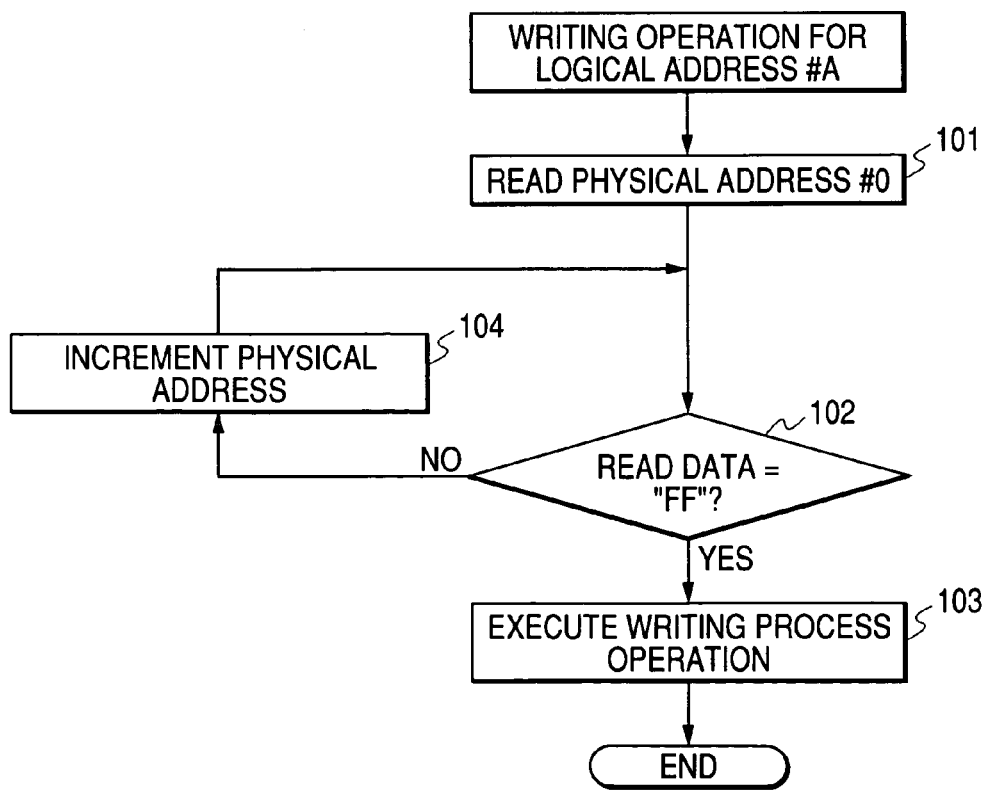
FIG. 2 is a flow chart for indicating flow operations of a writing operation in the first embodiment.

Next, operations of the semiconductor memory device of this first embodiment will now be explained. First, a description is made of a writing operation. FIG. 2 is a flow chart for explaining flow operations as to the writing operation in the first embodiment. When a writing operation is performed with respect to the logical address #A, first of all, a reading operation of the physical address #0 within the non-volatile memory 2 is carried out (step 101). If the read data corresponds to "FF" (step 102), then a writing operation is executed with respect to the physical address #0 (step 103).

If the read value is a value other than "FF", then the address is incremented by 1 (step 104), and next, a reading operation of the physical address #1 is carried out. Similarly, if a read data corresponds to "FF", then a writing operation with respect to the physical address #1 is subsequently carried out. If the read data is a value other than "FF", then a reading operation of the physical address #2 is carried out. If a read value of the physical address #2 corresponds to "FF", then a writing operation is carried out with respect to the physical address #2. If the read value is a value other than "FF", then a reading operation of the physical address #3 is subsequently carried out. As explained above, writing operations are sequentially carried out with respect to memory areas into which data has not been written (namely, data is not "FF") up to the physical address #n.

Figure 3:
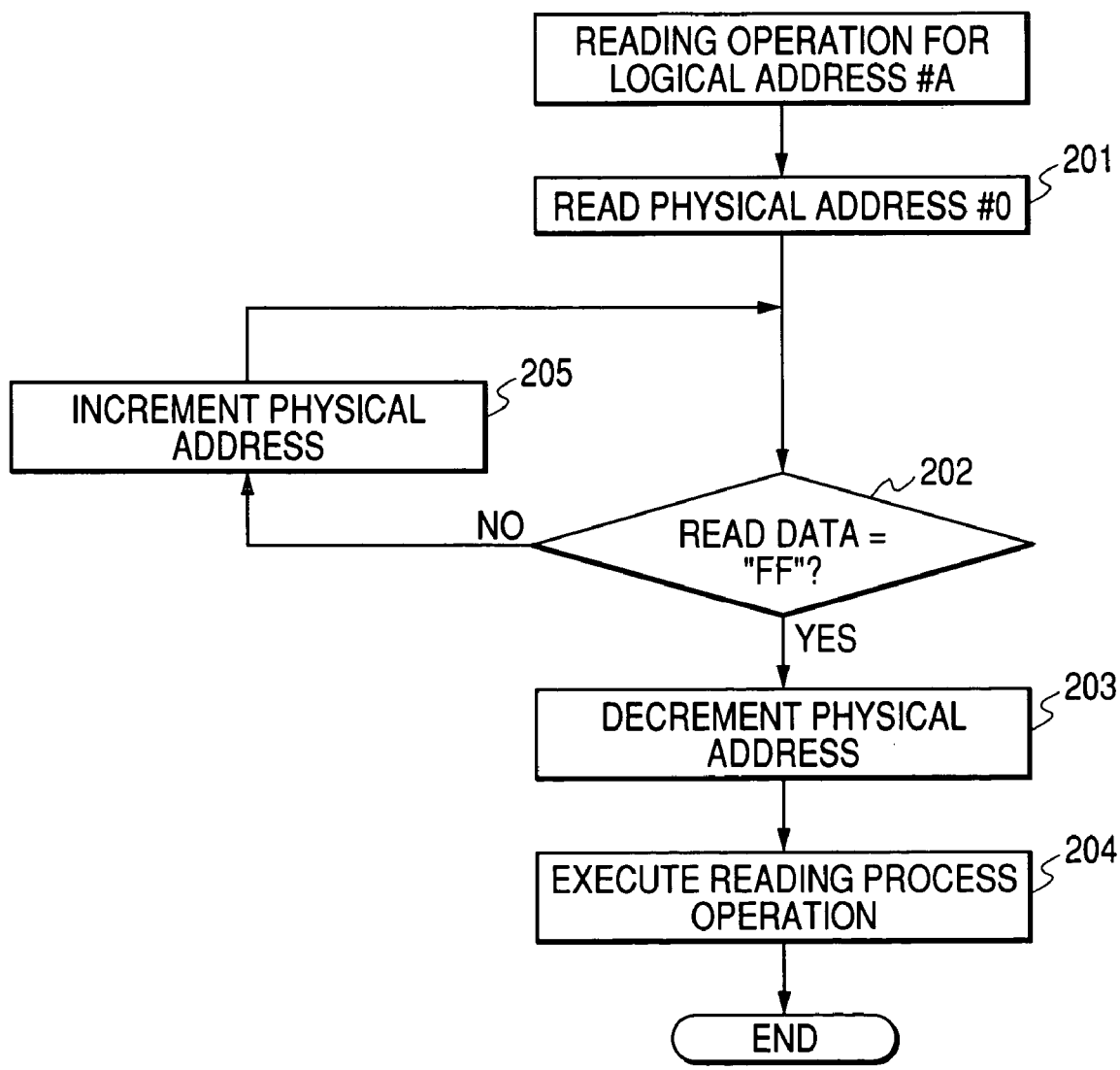
FIG. 3 is a flow chart for representing flow operations of a reading operation in the first embodiment.

Next, a reading operation will now be explained. FIG. 3 is a flow chart for indicating flow operations of this reading operation in the first embodiment. When a reading operation is carried out with respect to the logical address #A, a reading operation of the physical address #0 within the non-volatile memory 2 is firstly carried out (step 201). If a read value corresponds to "FF" (step 202), then a physical address is decremented by 1 (step 203). In this case, since this physical address corresponds to the physical address #0, this physical address #0 is not decremented, but the read value of this physical address #0 is outputted as data of the logical address #A under control of the output control unit 3 (step 204). In this case, no data is stored at the logical address #A.

If the read value corresponds to a value other than "FF" (step 203), then after the physical address is incremented by 1 (step 205), and subsequently, a reading operation as to the physical address #1 is carried out. If the read value corresponds to "FF" (step 202), the physical address is decrement by 1 (step 203), and the read value of the physical address #0 preceding to the above-described physical address #1 by 1 is outputted as the data of the logical address #A (step 204).

Similarly, if a read value of the physical address #1 corresponds to a value other than "FF", then a reading operation as to the physical address #2 is subsequently carried out. If the read value of the physical address #2 corresponds to "FF", then the read value at the physical address #1 is outputted as the data of the logical address #A under control of the output control unit 3. If the read value of the physical address #2 corresponds to a value other than "FF", a reading operation as to the physical address #3 is subsequently carried out. As explained above, data are sequentially read out from the physical address #0, and thus, such a value of a physical address memory preceding to such a physical address whose read value has been "FF" by 1 is outputted as read data.

As previously explained, in the writing operation with respect to the logical address #A, since the physical address is sequentially moved in this manner of #0, #1, #2, - - - , the data can be rewritten without performing the erasing process operation. Also, in the reading operation with respect to the logical address #A, since the reading operations are sequentially carried out in this manner of the physical address #0, #1, #2, - - - , the data which has been written at last is judged, and can be outputted as the output of the logic address #A. In other words, it can be regarded that the logic address #A has been rewritten.

Second Embodiment

Figure 4:
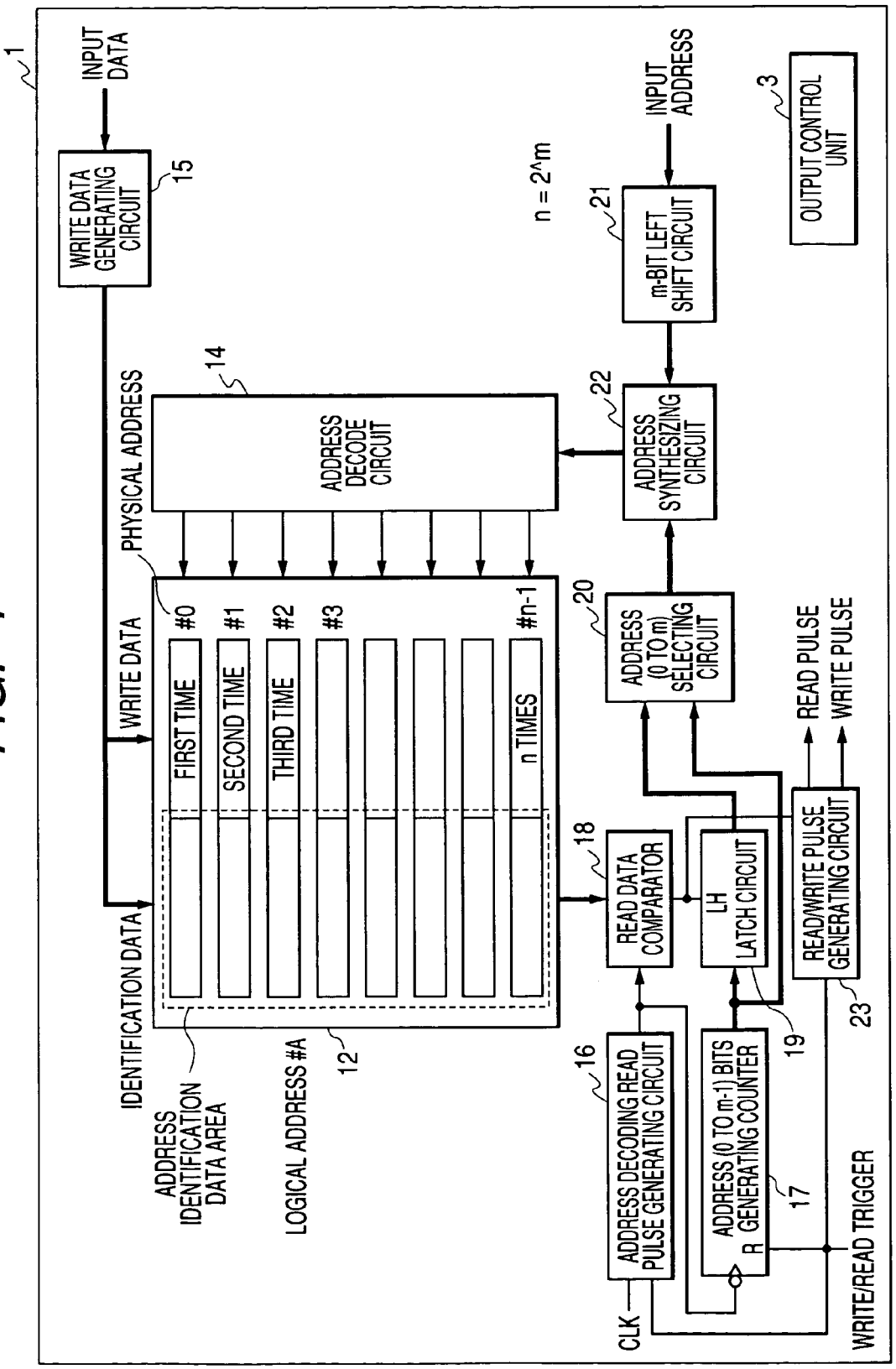
FIG. 4 is a block diagram for showing a structure of a semiconductor memory device according to a second embodiment of the present invention.

FIG. 4 is a block diagram for showing a structure of a semiconductor memory device according to a second embodiment of the present invention. Reference numeral 1 shows a non-volatile memory device (either EPROM or flash EEPROM), reference numeral 12 indicates a non-volatile memory corresponds to an aggregated member of a plurality of physical address memories #0, #1, - - - , #n, which are constituted by a write data area and an address identification data area. Also, reference numeral 3 represents an output control unit for controlling outputs of memory data, reference numeral 14 shows an address decode circuit of either the normal EPROM or the flash EEPROM, reference numeral 15 indicates a write data producing circuit, reference numeral 16 represents a read pulse generating circuit for reading address identification data, and reference numeral 17 shows an address generating counter which sequentially increments addresses of the address identification data area from a least significant address thereof in synchronism with an address identification data reading pulse. Also, reference numeral 18 indicates a comparator for comparing data read from the address identification data area with a predetermined identification data value, reference numeral 19 represents an address latch for latching a count value of the address generating counter 17 in response to an output of the comparator 18, reference numeral 20 indicates an address selecting circuit which selects a proper address from a value of the address generating counter 17 and a value of the address latch 19, depending upon either a process operation with respect to the address identification data area or a process operation with respect to the write data area, and also reference numeral 21 shows a shift circuit for shifting an input address by "m" bits along a left direction. Also, reference numeral 22 shows an address synthesizing circuit for synthesizing an output of the address selecting circuit 20 with an output of the shift circuit 21 so as to supply a desirable physical address to the address decode circuit 14, and reference numeral 23 indicates a pulse generating circuit for generating both a write pulse and a read pulse with respect to the logical address #A.

Figure 5:
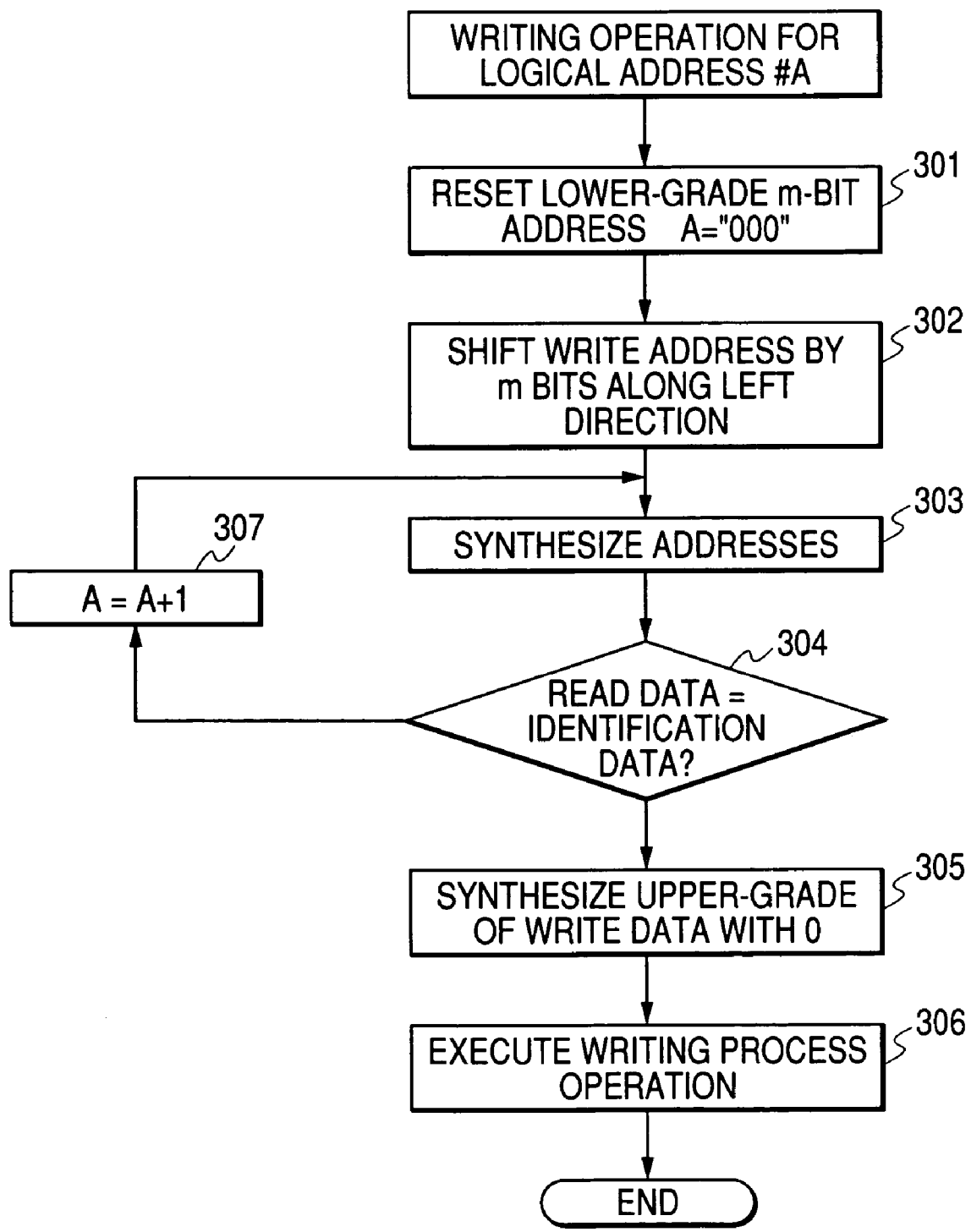
FIG. 5 is a flow chart for indicating flow operations of a writing operation in the second embodiment.

First, a description is made of a writing operation. FIG. 5 is a flow chart for explaining flow operations as to the writing operation in the second embodiment. When a writing operation is performed with respect to the logical address #A, first of all, the address generating counter 17 is reset (step 301), and thus, the present address becomes the address #0. At the same time, the read pulse generating circuit 16 generates a read pulse.

During the reading operation of the address identification data, the address selecting circuit 20 selects the value of the address generating counter 17, whereas during other operations than this reading operation (namely, reading/writing process operations with respect to logical address #A), the address selecting circuit 20 selects the value of the address latch 19. In this case, since the address identification data is being read, the value of the address generating counter 17 is selected by the address selecting circuit 20.

On the other hand, while the above-described address value is selected by the address selecting circuit 20, the input address (logical address #A) has been shifted by "m" bits by the shift circuit 21 along the left direction (step 302), the output of the shift circuit 21 is synthesized with bits "0" to (m−1) of an address corresponding to the output of the address selecting circuit 20 by the address synthesizing circuit 22 (step 303), and the physical address #0 is selected by the address decode circuit 14.

As a result, the reading operation of the physical address #0 within the non-volatile memory 12 is carried out, and then, the read data is compared with predetermined identification data by the comparator 18 (step 304). When the comparison result is "not coincident", the value of the address generating counter 17 is acquired by the address latch 19, and at the same time, the pulse generating circuit 23 generates a write pulse.

When the write pulse is generated, the address selecting circuit 20 selects the value of the address latch 19, and this selected value is synthesized with the output of the shift circuit 21 by the address synthesizing circuit 22, and then, the physical address #0 is selected by the address decode circuit 14. Also, in the write data generating circuit 15, such a write data which is obtained by synthesizing the predetermined identification data with the entered write data is generated (step 305), the input data is written in the write data area of the physical address #0, and the predetermined identification data is written in the address identification data region (step 306).

Now, a description is made of such a case that a comparison result of the comparator 18 is "coincident" (namely, read data is made coincident with predetermined identification data). When the comparison result is "coincident", the value of the address generating counter 17 is incremented (step 307), this value is changed from "0" to "1." Also, the read pulse generating circuit 16 again generates a read pulse. At this time, the address selecting circuit 20 again selects the value of the address generating counter 17, bits "0" to "m−1" of an address corresponding to this selected address value are synthesized with the output of the shift circuit 21 by the address synthesizing circuit 22 (step 303), a reading operation of the physical address #1 within the non-volatile memory 12 is carried out, and then, the read data is compared with the predetermined identification data by the comparator 18 (step 304). When a comparison result becomes "not coincident", both write data and the predetermined identification data are written with respect to the physical address #1 in a similar manner to such a case of the above-described physical address #0 (step 305).

On the other hand, when the comparison result becomes "coincident", the value of the address generating counter 17 is incremented (step 306) in a similar to such a case of the above-described physical address #0, the read pulse generating circuit 16 again generates an address identification data reading pulse, and a reading operation of the physical address #2 is carried out. Thus, when the comparison result is "coincident", a writing operation is carried out with respect to such a memory that such an identification data obtained by sequentially reading the physical addresses from the physical address #3 up to the physical address #n (n=2m−1) is not made coincident with the predetermined identification data (step 305). That is to say, this memory is a memory into which identification data has not yet been written.

Figure 6:
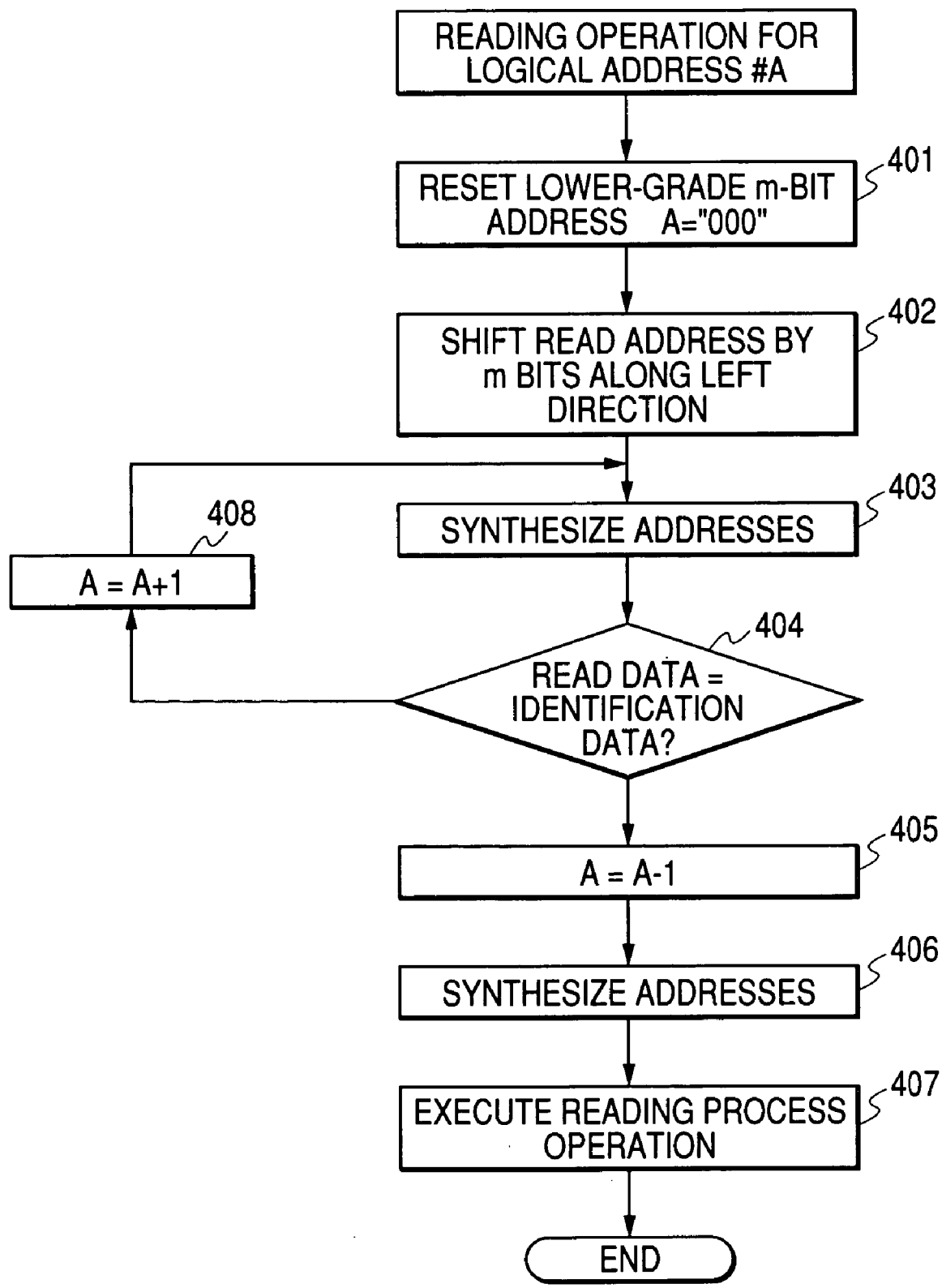
FIG. 6 is a flow chart for representing flow operations of a reading operation in the second embodiment of the present invention.

Next, a reading operation will now be explained. FIG. 6 is a flow chart for indicating flow operations of this reading operation in the second embodiment. When a reading operation is carried out with respect to the logical address #A, the address generating counter 17 is firstly reset, so that the count value thereof becomes the address #0 (step 401). At the same time, the read pulse generating circuit 16 generates the read pule.

During the reading operation of the address identification data, the address selecting circuit 20 selects the value of the address generating counter 17, whereas during other operations than this reading operation (namely, reading/writing process operations with respect to logical address #A), the address selecting circuit 20 selects the value of the address latch 19. In this case, since the address identification data is being read, the value of the address generating counter 17 is selected by the address selecting circuit 20.

On the other hand, while the above-described address value is selected by the address selecting circuit 20, the input address (logical address #A) has been shifted by "m" bits by the shift circuit 21 along the left direction (step 402), the output of the shift circuit 21 is synthesized with bits "0" to (m−1) of an address corresponding to the output of the address selecting circuit 20 by the address synthesizing circuit 22 (step 403), and the physical address #0 is selected by the address decode circuit 14.

As a result, the reading operation of the physical address #0 within the non-volatile memory 12 is carried out, and then, the read data is compared with predetermined identification data by the comparator 18 (step 404). When the comparison result is "coincident", the address generating counter 17 is sequentially incremented in a similar manner to the above-described writing operation (step 408). This incrementing operation is repeatedly carried out until the read data is not made coincident with the predetermined identification data.

When the comparison result is "not coincident", the count value of the address generating counter 17 is latched by the address latch 19. At the same time, the pulse generating circuit 23 generates a read pulse with respect to the logic address #A.

At this time, the address selecting circuit 20 outputs, a value (latched value-1) of the address latch 19 (step 405), and then, this value (latched value-1) is synthesized with the output of the shift circuit 21 by the address synthesizing circuit 22 (step 406), and a desirable physical address is selected by the address decoder 14. As a result, such a physical address value of a physical address memory preceding to the physical address by 1 at which the read data has been not made coincident with the identification data is outputted as the read data under control of the output control unit 3 (step 407). In other words, such a physical address value of a physical address memory into which data has been finally written is outputted as the read data under control of the output control unit 3.

As previously described, in accordance with this second embodiment, similar to the first embodiment, in the writing operation with respect to the logical address #A, since the physical address is sequentially moved in this manner of #0, #1, #2, - - - , the data can be rewritten without performing the erasing process operation. Also, in the reading operation with respect to the logical address #A, since the reading operations are sequentially carried out in this manner of the identification data areas #0, #1, #2, - - - , within the physical addresses, the data which has been written at last is judged, and can be outputted as the output of the logic address #A. Due to such an effect, it can be regarded that the logic address #A of the non-volatile memory 12 has been rewritten. Furthermore, while a specific limitation is not made in the data which is written at the logical address #A, the physical address memory may be employed so as to store such a data which is wanted to be arbitrarily rewritten.

Third Embodiment

Figure 7:
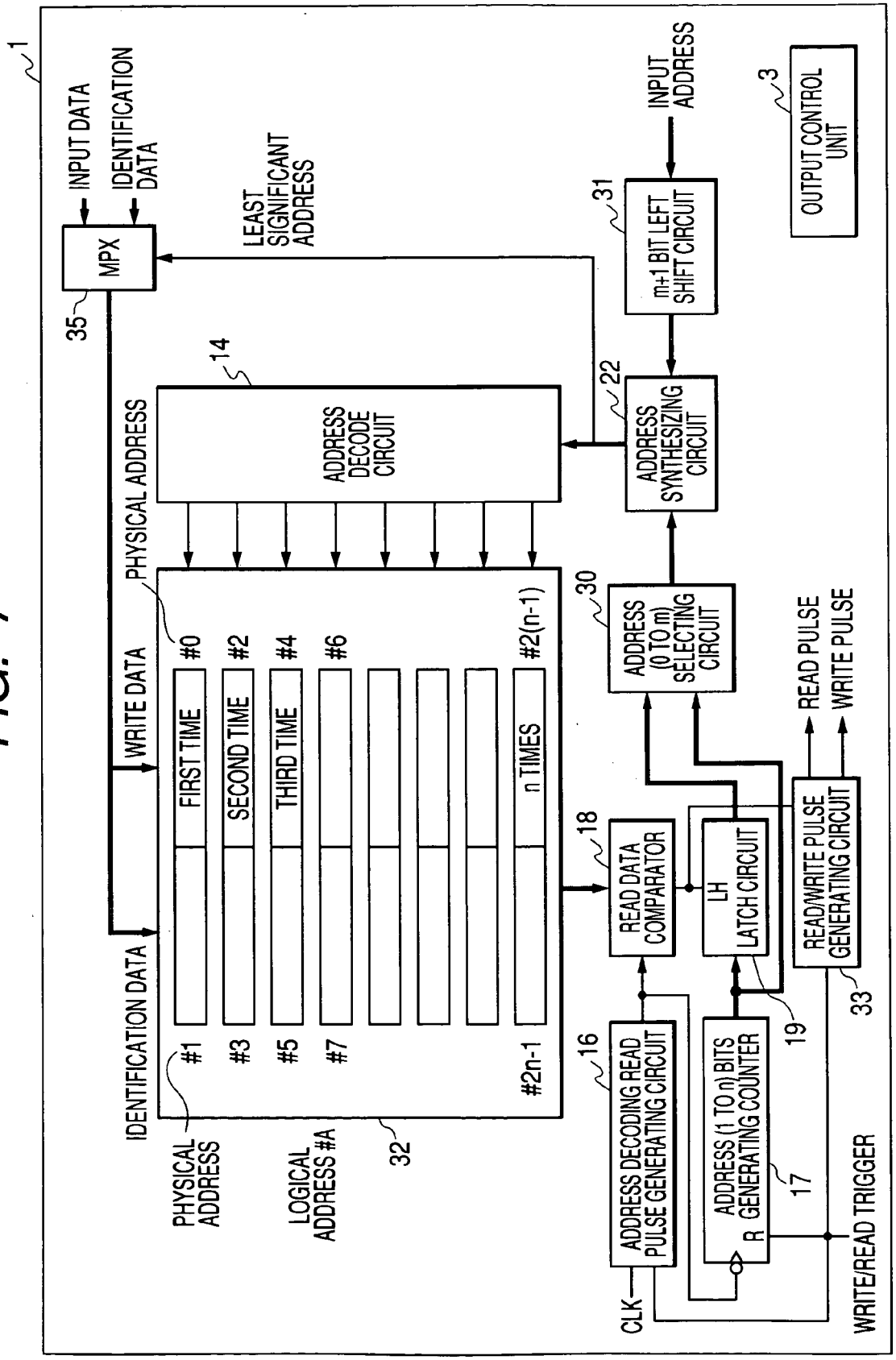
FIG. 7 is a block diagram for showing a structure of a semiconductor memory device according to a third embodiment of the present invention.

FIG. 7 is a block diagram for schematically showing an arrangement of a semiconductor memory device according to a third embodiment of the present invention. It should be understood that same reference numerals indicated in the second embodiment will be employed as those for denoting the same, or similar structural elements shown in the third embodiment, and explanations thereof will be similarly made. Reference numeral 1 shows a non-volatile memory device (either EPROM or flash EEPROM), and reference numeral 32 denotes a non-volatile memory corresponding to an aggregated member made of both a plurality of write data area physical address memories #0, #2, - - - , #n−1 and a plurality of address identification data area physical address memories #1, #3, - - - #n. Also, reference numeral 3 shows an output control unit for controlling outputs of memory data, reference numeral 30 indicates an address selecting circuit which selects a proper address from a value of the address generating counter 17 and a value of the address latch 19, depending upon either a process operation with respect to the address identification data area or a process operation with respect to the write data area, and also, which selects a least significant address. Reference numeral 31 shows a shift circuit for shifting an input address by (m+1) bits along a left direction; reference numeral 33 indicates a pulse generating circuit for generating a read pulse with respect to the logical address #A, a write pulse with respect to the write data area, and a write pulse with respect to an address identification data area; and reference numeral 35 indicates a data selecting circuit (MPX) which selects data to be written from input data and predetermined identification data, depending upon such a condition that an address corresponds to either the write data area or the address identification data area.

Figure 8:
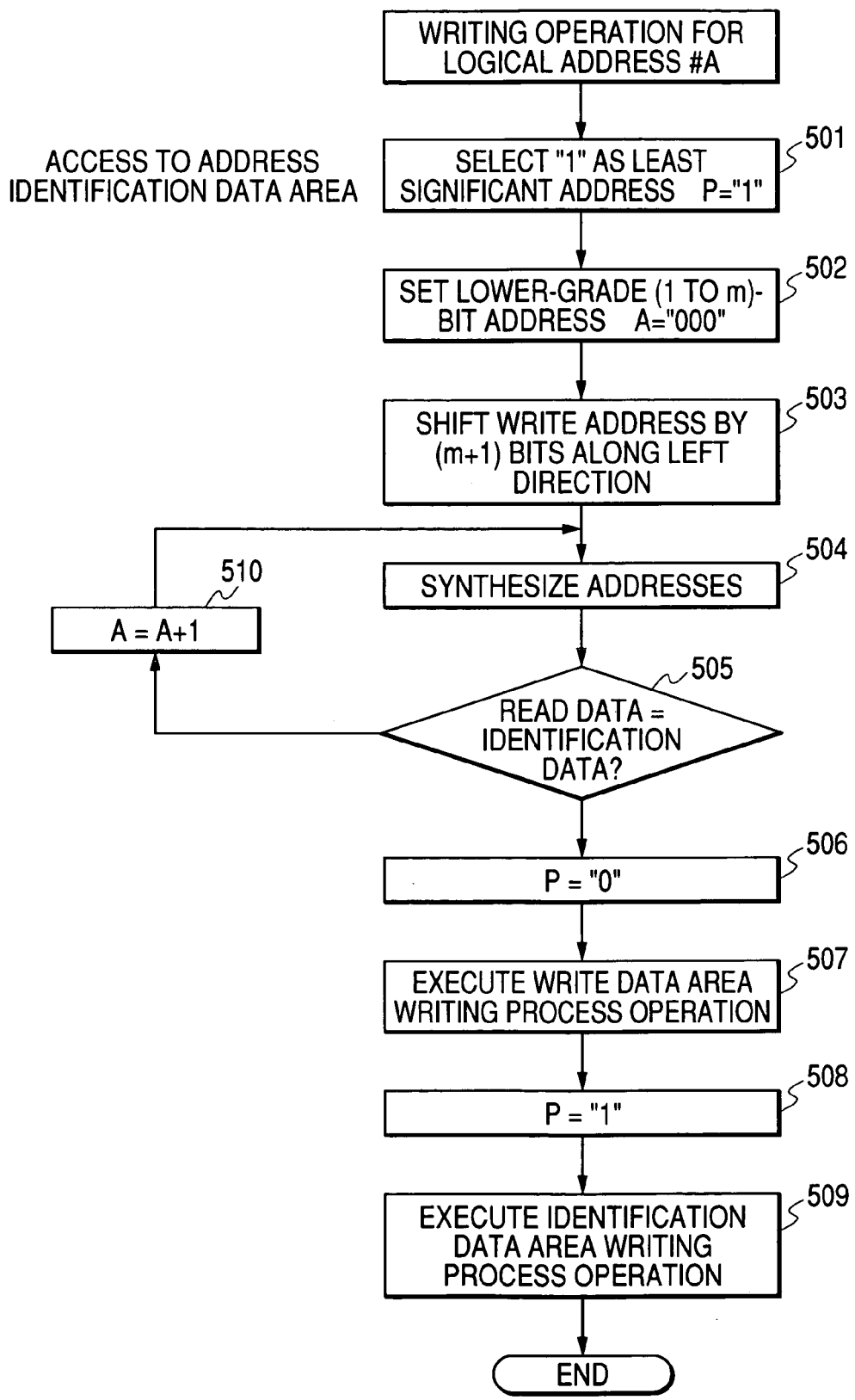
FIG. 8 is a flow chart for indicating flow operations of a writing operation in the third embodiment.

Next, operations of the semiconductor memory device of this third embodiment will now be explained. First, a description is made of a writing operation. FIG. 8 is a flow chart for explaining flow operations as to the writing operation in the third embodiment. When a writing operation is performed with respect to the logical address #A, first of all, the address generating counter 17 is reset, and thus, the present address becomes the address #0. At the same time, the read pulse generating circuit 16 generates a read pulse.

During the reading operation of the address identification data, the address selecting circuit 30 selects the value (address bits 1 to m) of the address generating counter 17, whereas during other operations than this reading operation (namely, reading/writing process operations with respect to logical address #A), the address selecting circuit 20 selects the value of the address latch 19. In this case, since the address identification data is being read, the value of the address generating counter 17 is selected by the address selecting circuit 30.

The address selecting circuit 30 selects a least significant address "1" when the address identification data area is accessed, whereas the address selecting circuit 30 selects a least significant address "0" when the write data area is accessed. In this case, since the address identification data is being read, and the least significant address "1" is selected by the address selecting circuit 30 (step 501), as the address of the address generating counter 17, lower-grade "1" to "m"-bit address become #0 (step 502).

On the other hand, while the above-described address value is selected by the address selecting circuit 30, the input address (logical address #A) has been shifted by "m+1" bits by the shift circuit 31 along the left direction (step 503), the output of the shift circuit 31 is synthesized with bits "0" to "m" of an address corresponding to the output of the address selecting circuit 30 by the address synthesizing circuit 22 (step 504), and the physical address #1 is selected by the address decode circuit 14.

Therefore, the reading operation of the physical address #1 within the non-volatile memory 32 is carried out, and then, the read data is compared with predetermined identification data by the comparator 18 (step 505). When the comparison result is "not coincident", the value of the address generating counter 17 is acquired by the address latch 19, and at the same time, the pulse generating circuit 33 generates a write pulse.

When the write pulse is generated, the address selecting circuit 30 selects the value of the address latch 19, and this selected value is synthesized with the output of the shift circuit 31 by the address synthesizing circuit 22, and then, the physical address is selected by the address decode circuit 14. In this example, since the pulse generating circuit 33 generates write pulses two times in a continuous manner and the least significant address is changed from "0" to "1" in synchronism with this generation of the write pulses, the address selecting circuit 30 selects the physical address #0 when the least significant address is "0" (step 506). Subsequently, when the least significant address is "1" (step 508), the address selecting circuit 30 selects the physical address #1.

Also, in the write data selecting circuit 35, when the least significant address is "0", the input data is selected, whereas when the least significant address is "1", the predetermined identification data is selected. As a result, the input data is written into the write data area of the physical address #0 (step 507), and the predetermined identification data is written into the address identification data area of the physical address #1 (step 509).

Now, a description is made of such a case that a comparison result of the comparator 18 is "coincident." When the comparison result is "coincident", the value of the address generating counter 17 is incremented (step 510), this value is changed from "0" to "1." Also, the read pulse generating circuit 16 again generates a read pulse. At this time, the address selecting circuit 30 again selects the value of the address generating counter 17 and the least significant bit "1", bits "0" to "m" of an address corresponding to this selected address value are synthesized with the output of the shift circuit 31 by the address synthesizing circuit 22, a reading operation of the physical address #3 within the non-volatile memory 32 is carried out. Then, the read data is compared with the predetermined identification data by the comparator 18.

When a comparison result becomes "not coincident", similar to the case of the above-explained physical address #1, the predetermined identification data is written with respect to the physical address #0, and the write data is written with respect to the physical address #1. On the other hand, when the comparison result becomes "coincident", the value of the address generating counter 17 is incremented in a similar to such a case of the above-described physical address #1, the read pulse generating circuit 16 again generates an address identification data reading pulse, and a reading operation of the physical address #5 is carried out. Thus, when the comparison result is "coincident", a writing operation is carried out with respect to such a memory that both the input data and the predetermined identification data are written. In this memory, such an identification data obtained by sequentially reading from the physical address #7 up to the physical address #n (n=2m+1) is not made coincident with the predetermined identification data. That is to say, this memory is a memory into which identification data has not yet been written.

Figure 9:
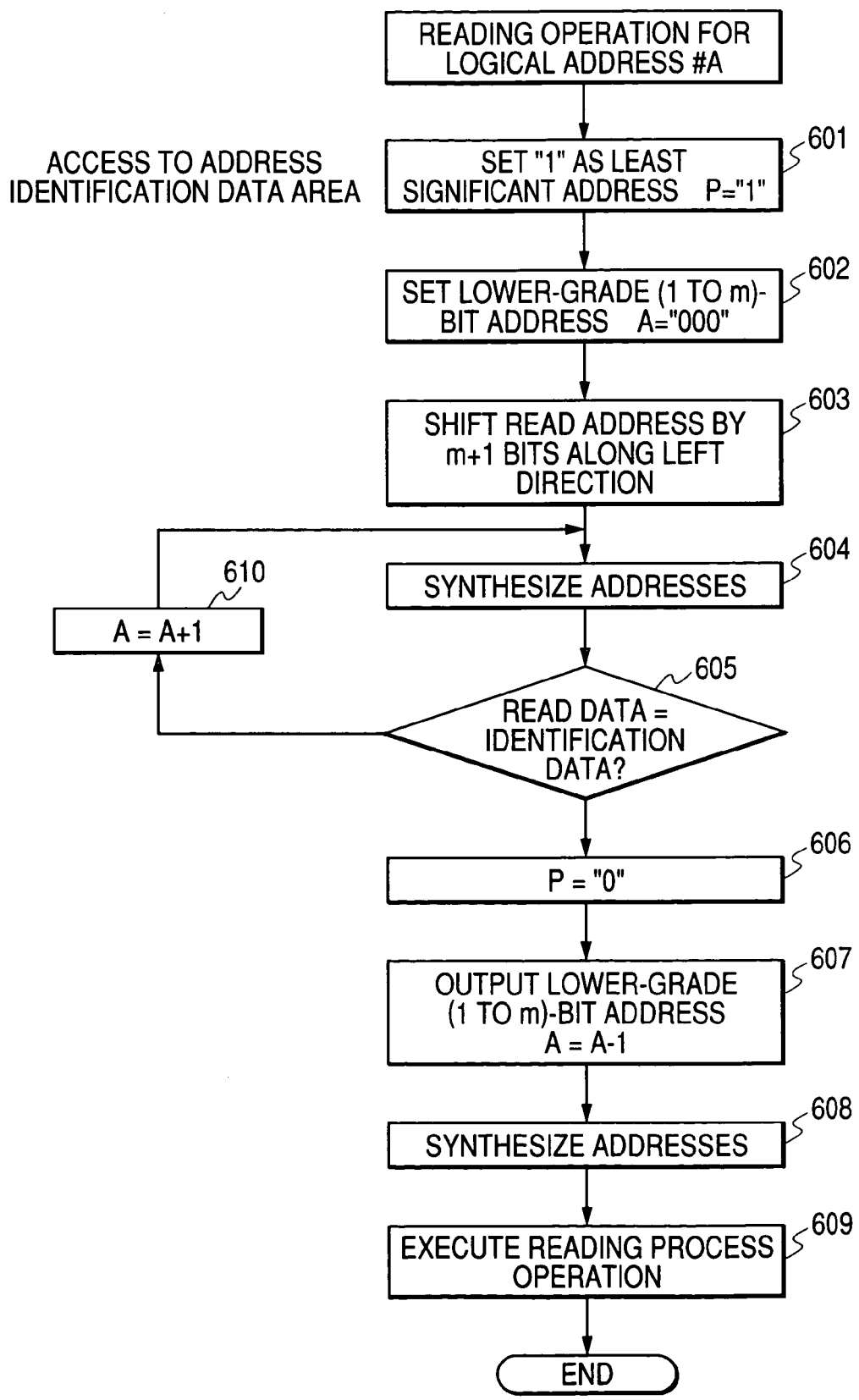
FIG. 9 is a flow chart for representing flow operations of a reading operation in the third embodiment of the present invention.

Next, a reading operation will now be explained. FIG. 9 is a flow chart for indicating flow operations of this reading operation in the third embodiment. When a reading operation is carried out with respect to the logical address #A, the address generating counter 17 is firstly reset, so that the value thereof becomes an address #0. At the same time, the read pulse generating circuit 16 generates a read pulse.

While the address identification data is read, the address selecting circuit 30 selects the value of the address generating counter 17 at the address bits "1" to "m", whereas the address selecting circuit 30 selects "1" at the least significant bit (step 601). As a result, as to the address of the address generating counter 17, the lower grade "1" to "m" bits addresses become #0 (step 602).

On the other hand, while the above-described address value is selected by the address selecting circuit 30, the input address (logical address #A) has been shifted by (m+1) bits by the shift circuit 31 along the left direction (step 603), the output of the shift circuit 31 is synthesized with the output of the address selecting circuit 30 by the address synthesizing circuit 22 (step 604), and the physical address #1 is selected by the address decode circuit 14.

As a result, the reading operation of the physical address #1 within the non-volatile memory 32 is carried out, and then, the read data is compared with predetermined identification data by the comparator 18 (step 605). When the comparison result is "coincident", the address generating counter 17 is sequentially incremented in a similar manner to the above-explained writing operation (step 610), and this incrementing operation is repeatedly carried out until the read data is not made coincident with the predetermined identification data.

When the comparison result is "not coincident", the count value of the address generating counter 17 is latched by the address latch 19. At the same time, the pulse generating circuit 23 generates a read pulse with respect to the logic address #A. At this time, the address selecting circuit 30 outputs "0" of the least significant address (step 606), and outputs a value (latched value-1) of the address latch 19 at the addresses "1" to "m" (step 607). This output value is synthesized with the output of the shift circuit 31 by the address synthesizing circuit 22 (step 608), and a desirable physical address is selected by the address decoder 14. As a consequence, such a physical address value of a write data area corresponding to the physical address memory preceding to the address identification data area physical address by 1, at which the read data has not been made coincident with the identification data is read (step 609) to be outputted as the read data under control of the output control unit 3. In other words, such a value of a physical address which has been finally written in the write data area is read to be outputted as the read data under control of the output control unit 3.

As previously described, similar to the second embodiment of the present invention, in the writing operation with respect to the logical address #A, since the physical address is sequentially moved in this manner of #0, #1, #2, - - -, the data can be rewritten without performing the erasing process operation and without setting a specific limitation to the write data. Also, in the reading operation with respect to the logical address #A, since the reading operations are sequentially carried out in this manner of the physical address #0, #1, #2, - - -, the data which has been written at last is judged, and can be outputted as the output of the logic address #A. In other words, it can be regarded that the logic address #A has been rewritten. Furthermore, the data can be rewritten in the unit of a word without reducing a word length of the data.

Fourth Embodiment

Figure 10:
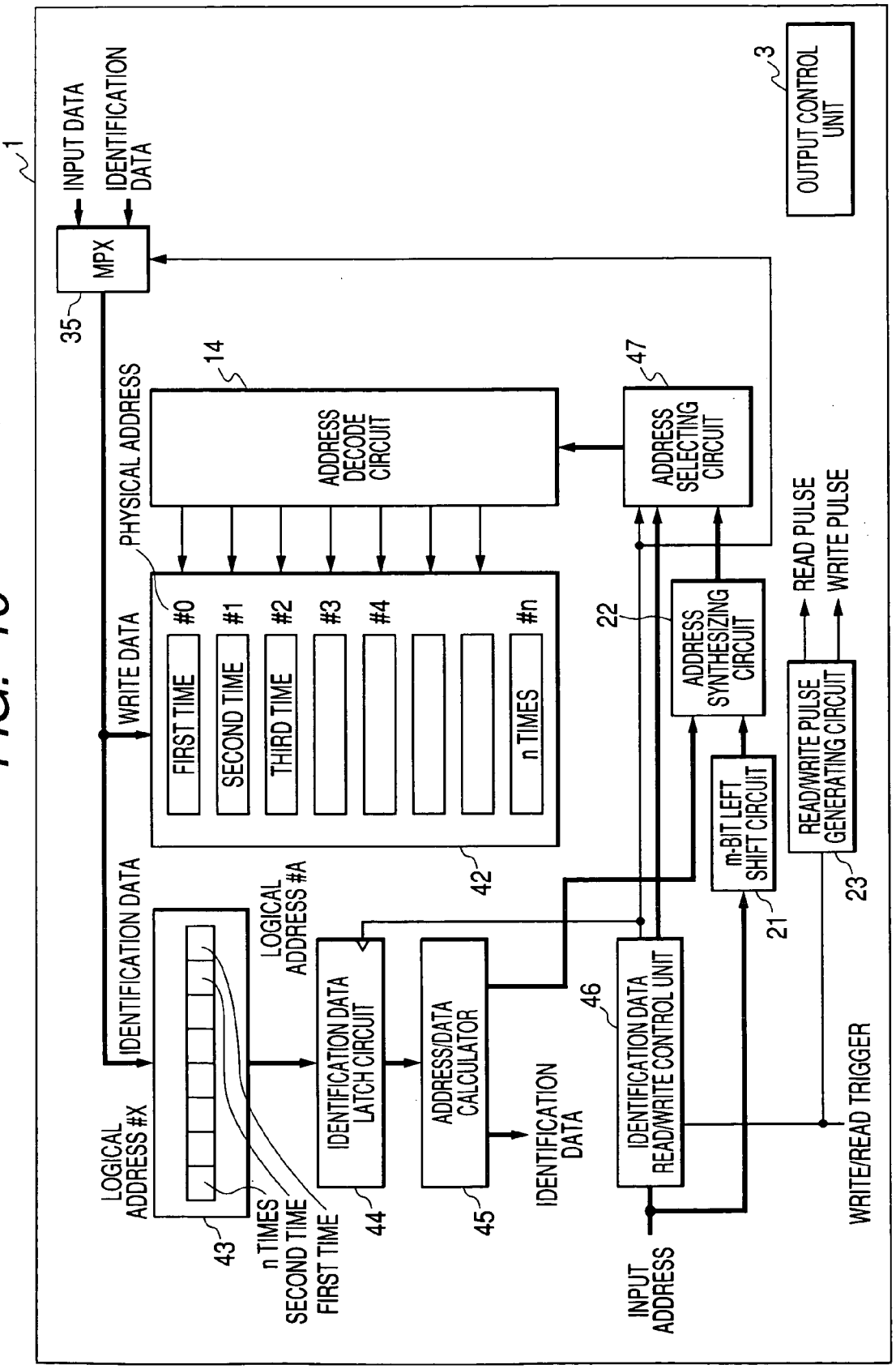
FIG. 10 is a block diagram for showing a structure of a semiconductor memory device according to a fourth embodiment of the present invention.

FIG. 10 is a schematic diagram for showing a structure of a semiconductor memory device according to a fourth embodiment of the present invention. Reference numeral 1 shows non-volatile memory device (either EPROM or flash EEPROM), reference numeral 42 indicates a non-volatile memory corresponding to an aggregated member made of a plurality of physical address memories #0, #1, - - -, #n, and reference numeral 3 shows an output control unit for controlling outputs of memory data. Also, reference numeral 43 shows an address identification data memory corresponding to a non-volatile memory arranged at a logical address "X", and is constituted by a non-volatile memory having the same bit number as the word number of the non-volatile memory 42, and reference numeral 44 represents an identification data latch which acquires a value of the address identification data memory 43 when either a read operation or a write operation is carried out with respect to the non-volatile memory 42. Also, reference numeral 45 represents an address/data calculator which calculates an identification data value which is subsequently written, and calculates physical address bits "0" to "(m−1)" of the non-volatile memory 42 from a value of the identification data latch 44, reference numeral 46 shows an identification data read/write control unit for calculating an address of the identification data memory 43 from an input address, and for generating a read pulse. Reference numeral 47 indicates an address selecting circuit which selects the output of the identification data read control unit 46 when an access operation to an address identification data memory area is performed, and selects the output of the address synthesizing circuit 22 when an access operation to a write data area is carried out. An address decode circuit 14, a shift circuit 21, an address synthesizing circuit 22, and a pulse generating circuit 23 own the same functions as those of the second embodiment.

Figure 11:
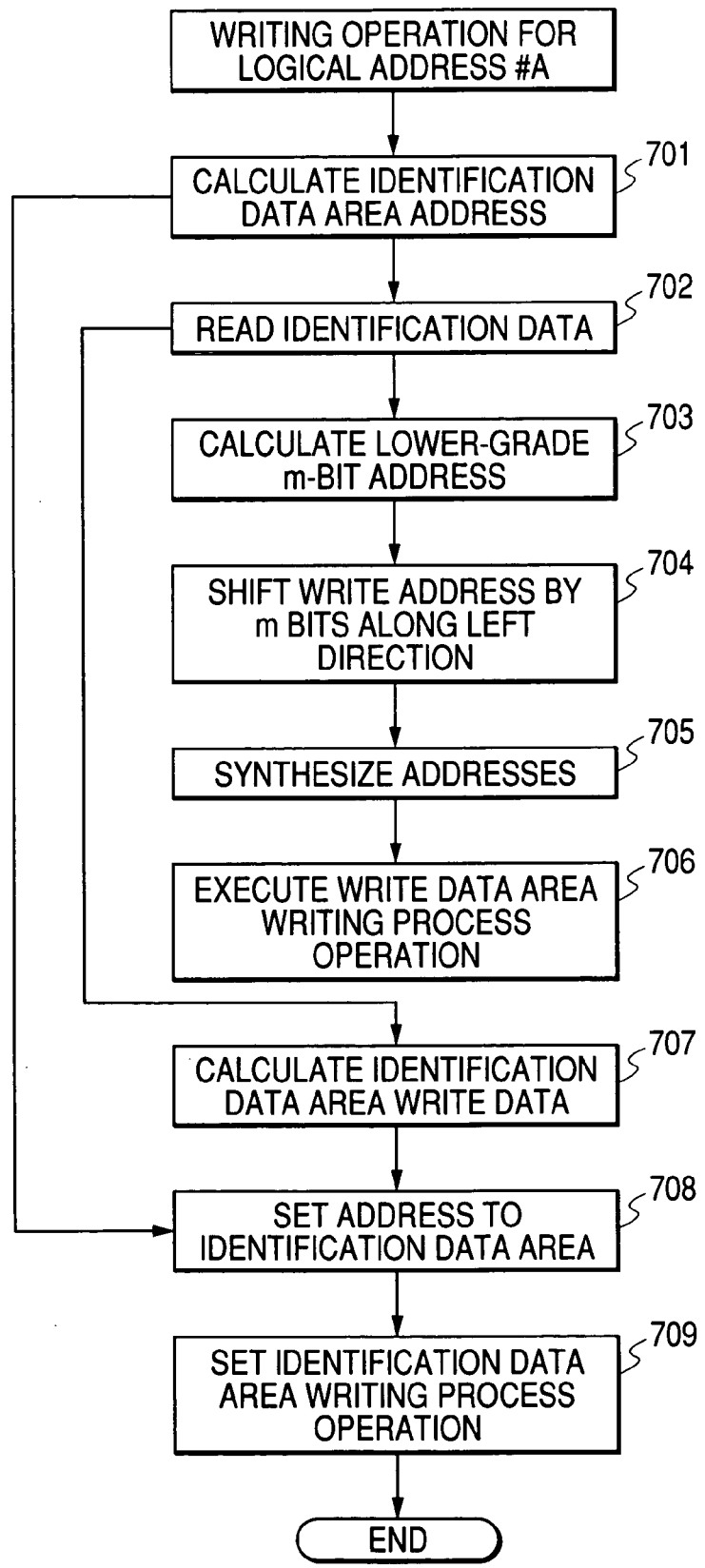
FIG. 11 is a flow chart for indicating flow operations of a writing operation in the fourth embodiment.

Next, operations of the semiconductor memory device of this embodiment will now be explained. First, a description is made of a writing operation. FIG. 11 is flow chart for explaining flow operations as to the writing operation in the fourth embodiment. When a writing operation is performed with respect to the logical address #A, first of all, the identification data read/write control unit 46 calculates an identification data address based upon an input address (step 701), and generates a read pulse of an identification data area.

At this time, since the address selecting circuit 47 selects the output of the identification data read/write control unit 46, a physical address "X" within the address identification data memory 43 is selected by the address decode circuit 14 so as to read identification data (step 702). In this case, the read identification data is latched by the identification data latch 44.

Thus, the address data calculator 45 calculates address bits "0" to (m−1) from the value of the identification data (step 703), while the address bits "0" to (m−1) are used to select a physical address within the non-volatile memory 42 into which the data will be written at the next time. The calculated address bits "0" to (m−1) are entered to the address synthesizing circuit 22. The address synthesizing circuit 22 synthesizes a write address (step 704) which has been shifted by "m" bits by the shift circuit 21 along the left direction with the output of the address/data calculator 45 (step 705), and then the synthesized address is entered to the address selecting circuit 47.

Since the pulse generating circuit 23 generates a write pulse to the logic address #A, the address selecting circuit 47 selects the output of the address synthesizing circuit 22, and the address decode circuit 14 selects anyone of the physical addresses #0 to #n (n=2m−1). For instance, if the value of the identification data latch 44 is (11111100), then the address decode circuit 14 judges that the data have already been written into the physical addresses #0 and #1, and thus selects the physical address #2.

The write data selecting circuit 35 judges an access operation to the write data area from the output of the identification data read/write control unit 46, and thus, selects write data, so that the write data is written into the physical address #2 (step 706).

After the data writing operation has been completed, the address/data calculator 45 produces such an identification data area write data in which only the least significant bit thereof is "0", and into which "0" has not yet been written among the identification data (step 707).

For example, if the value of the identification data latch 44 is (11111100), the address/data calculator 45 produces (11111011). At this time, the identification data read/write control unit 46 generates a write pulse of identification data, the write data selecting circuit 35 selects the identification data corresponding to the output of the address/data calculator 45, and the address selecting circuit 47 selects the identification data area address corresponding to the output of the identification data read/write control unit 46 (step 708). As a result, the identification data is written at the logical address "X" of the identification data area (step 709). Since the identification data is written without erasing operation, the value of the logical address "X" after the identification data has been written becomes (11111000).

Figure 12:
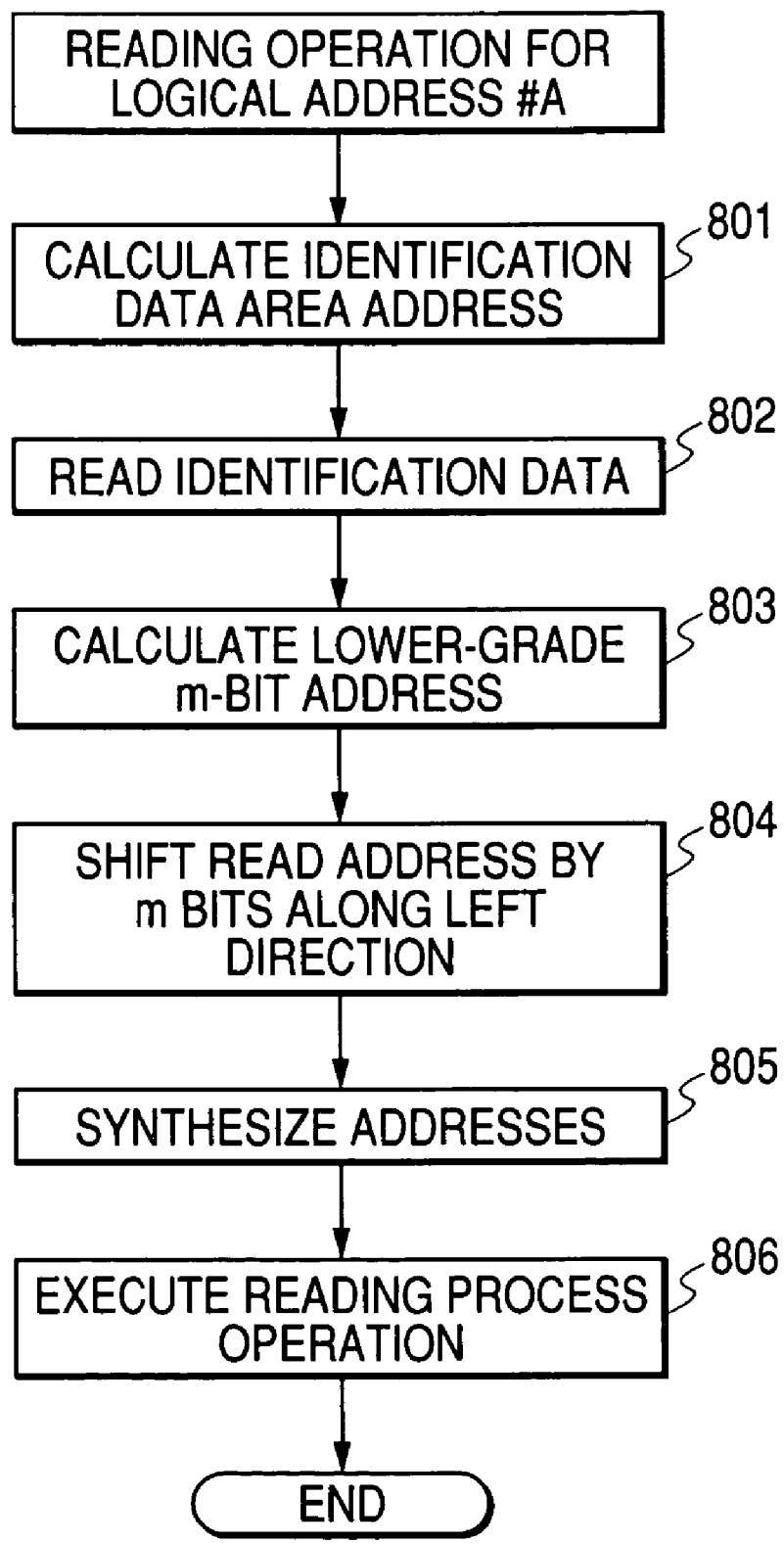
FIG. 12 is a flow chart for representing flow operations of a reading operation in the fourth embodiment.

Next, a reading operation will now be explained. FIG. 12 is a flow chart for indicating flow operations of this reading operation in the fourth embodiment. When a reading operation is carried out with respect to the logical address #A, a reading operation of the logical address #A, first of all, the identification data read/write control unit 46 calculates an identification data address from an input address (step 801), and generates a read pulse of an identification data area. At this time, since the address selecting circuit 47 selects the output of the identification data read/write control unit 46, a physical address "X" within the address identification data memory 43 is selected by the address decode circuit 14, so that a reading operation of identification data is carried out (step 802).

In this case, the read identification data is latched by the identification data latch 44. As a consequence, the address/data calculator 45 calculates address bits "0" to (m−1) for selecting a physical address within the non-volatile memory 42 to which a reading operation is executed from the value of the identification data (step 803), and then inputs the calculated address bits "0" to (m−1) into the address synthesizing circuit 22.

The address synthesizing circuit 22 synthesizes a read address which has been shifted by the shift circuit 21 (step 804) with the output of the address/data calculator 45 (step 805), and then enters the synthesized address to the address selecting circuit 47. Since the pulse generating circuit 23 generates a read pulse with respect to the logical address #A, the address selecting circuit 47 selects the output of the address synthesizing circuit 22, and the address decode circuit 14 selects any one of the physical addresses #0 to #n (n=2m−1). For example, if the value of the identification data latch 44 is (11111000), the address decode circuit 14 reads the physical address #2 (step 806), and then outputs the data of this physical address #2 as the read data under control of the output control unit 3.

As previously explained, in accordance with this fourth embodiment, similar to the third embodiment, in the writing operation with respect to the logical address #A, since the physical address is sequentially moved in this manner of #0, #1, #2, - - - , the data can be rewritten without performing the erasing process operation, while a specific restriction is set to the write data. Also, in the reading operation, since the reading operation of the identification data area is carried out, one of the plural physical addresses can be selected within a short time.

Also, since the identification data is set to 1 bit per one physical address of the non-volatile memory 42, the area occupied by the identification data area can be largely reduced.

Fifth Embodiment

Figure 13:
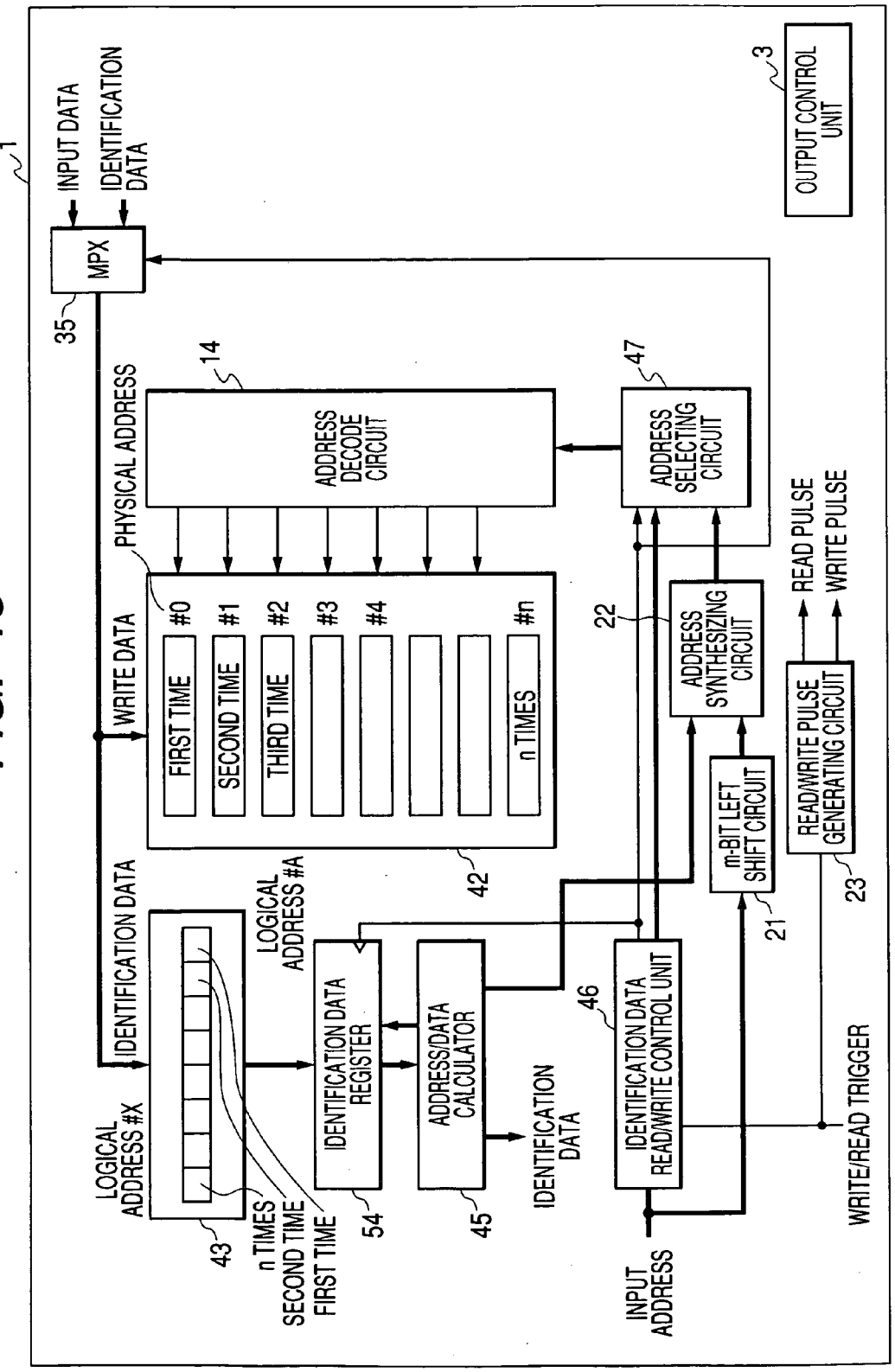
FIG. 13 is a block diagram for showing a structure of a semiconductor memory device according to a fifth embodiment of the present invention.

FIG. 13 is a block diagram for showing a structure of a semiconductor memory device according to a fifth embodiment of the present invention. Reference numeral 1 shows a non-volatile memory device (either EPROM or flash EEPROM), reference numeral 42 indicates a non-volatile memory corresponding to an aggregated member made of a plurality of physical address memories #0, #1, - - - , #n, and reference numeral 3 shows an output control unit for controlling outputs of memory data. Also, reference numeral 43 shows an address identification data memory corresponding to a non-volatile memory arranged at a logical address "X", and is constituted by a non-volatile memory having the same bit number as the word number of the non-volatile memory 42, and reference numeral 54 is a volatile identification data register which acquires/holds a value of the identification data memory 43 when a writing process operation of the identification data memory 43 is accomplished. It should be understood that all of an address/data calculator 45, an identification data read/write control unit 46, a shift circuit 21, a pulse generating circuit 23, an address synthesizing circuit 22, an address selecting circuit 47, an address decode circuit 14, and a write data selecting circuit 35 own the same functions of those employed in the fourth embodiment.

Figure 14:
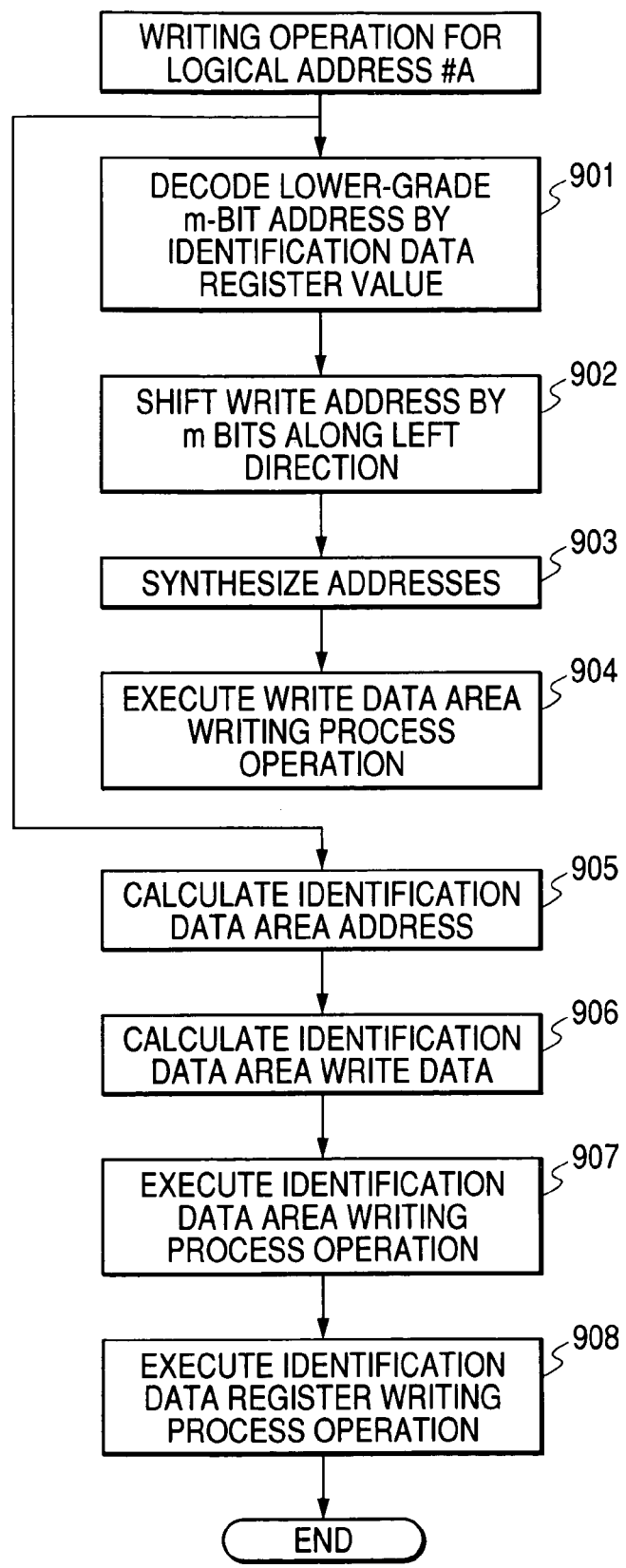
FIG. 14 is a flow chart for indicating flow operations of a writing operation in the fifth embodiment of the present invention.

Next, operations of the semiconductor memory device of this embodiment will now be explained. First, a description is made of a writing operation. FIG. 14 is a flow chart for explaining flow operations as to the writing operation in the fifth embodiment. When the power supply for the non-volatile memory 1 is turned ON, a storage content of the identification data memory 43 is firstly written into the read identification data register 54.

When a writing operation is carried out with respect to the logical address #A, the address/data calculator 45 calculates address bits "0" to (m−1) from the value of the identification data stored in the identification data register 54 (step 901), while the address bits "0" to (m−1) are used to select a physical address within the non-volatile memory 42 into which the data will be written at the next time. The calculated address bits "0" to (m−1) are entered to the address synthesizing circuit 22.

The address synthesizing circuit 22 synthesizes a write address (step 902) which has been shifted by "m" bits by the shift circuit 21 along the left direction with the output of the address/data calculator 45 (step 903), and then the synthesized address is entered to the address selecting circuit 47. Since the pulse generating circuit 23 generates a write pulse to the logic address #A, the address selecting circuit 47 selects the output of the address synthesizing circuit 22, and the address decode circuit 14 selects any one of the physical addresses #0 to #n (n=2m−1).

For example, if the value of the identification data latch 44 is (11111100), then the address decode circuit 14 judges that the data have already been written into the physical addresses #0 and #1, and thus selects the physical address #2. The write data selecting circuit 35 judges an access operation to the write data area from the output of the identification data read/write control unit 46, and thus, selects write data, so that the write data is written into the physical address #2 (step 904).

After the data writing operation has been completed, the address/data calculator 45 produces such an identification data area write data in which only the least significant bit thereof is "0", and into which "0" has not yet been written among the identification data (step 906). For example, if the value of the identification data latch 44 is (11111100), then the address/data calculator 45 produces (11111011). At this time, the identification data read/write control unit 46 generates a write pulse of identification data, the write data selecting circuit 35 selects the identification data corresponding to the output of the address/data calculator 45, and the address selecting circuit 47 selects the identification data area address corresponding to the output (step 905) of the identification data read/write control unit 46.

As a result, the identification data is written at the logical address "X" of the identification data area (step 907). Since the identification data is written without erasing operation, the value of the logical address "X" after the identification data has been written becomes (11111000). The foregoing operations are the substantially same as those of the fourth embodiment. In this fifth embodiment, such an identification which has been newly written at a falling edge of the identification data write pulse indicative of the completion of the writing operation is written into the identification data register 54 (step 908).

Figure 15:
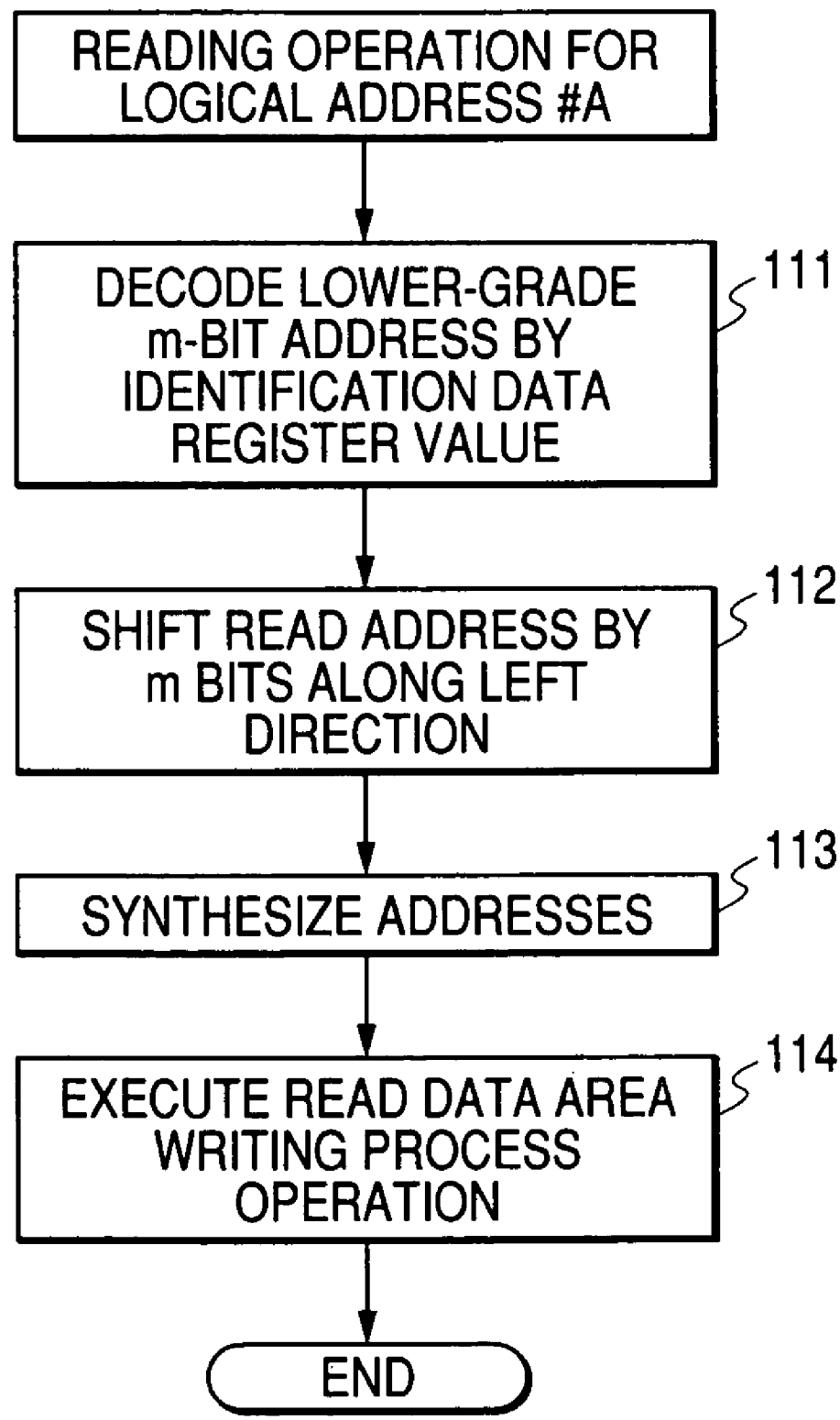
FIG. 15 is a flow chart for representing flow operations of a reading operation in the fifth embodiment of the present invention.

Next, a reading operation will now be explained. FIG. 15 is a flow chart for indicating flow operations of this reading operation in the fifth embodiment. When a reading operation is carried out with respect to the logical address #A, the address/data calculator 45 calculates address bits "0" to "m−1" from the identification data value stored in the identification data register 54 (step 111), and then enters these calculated address bits to the address synthesizing circuit 22. These address bits "0" to "m−1" are used to select a physical address within the non-volatile memory 42 into which the data will be written in the next time.

The address synthesizing circuit 22 synthesizes a read address (step 112) which has been shifted by "m" bits along the left direction by the shift circuit 21 with the output of the address/data calculator 45 (step 113), and then enters the synthesized address to the address selecting circuit 47. Since the pulse generating circuit 23 generates a read pulse with respect to the logical address #A, the address selecting circuit 47 selects the output of the address synthesizing circuit 22, and the address decode circuit 14 selects any one of the physical addresses #0 to #n (n=2m−1). For example, if the value of the identification data latch 44 is (11111000), then the address decode circuit 14 reads the physical address #2 (step 114), and outputs the data of this physical address #2 as the read data under control of the output control unit 3.

As previously explained, in accordance with this fifth embodiment, similar to the fourth embodiment, in the writing operation with respect to the logical address #A, since the physical address is sequentially moved in this manner of #0, #1, #2, - - -, the data can be rewritten without performing the erasing process operation, while a specific restriction is set to the write data. Also, in the reading operation, since the reading operation of the identification data area is carried out, one of the plural physical addresses can be selected within a short time.

Also, since the identification data is set to 1 bit per one physical address of the non-volatile memory 42, the area occupied by the identification data area can be largely reduced.

Furthermore, since the identification data is stored not only into the identification data memory 43 which is constituted by the non-volatile memory, but also into the volatile identification data register 54, the reading operation of the non-volatile memory for the address decoding operation is no longer required, and thus, the address decoding operation can be instantaneously carried out. In particular, during the reading operation, data can be read at the same speed as that of the normal EPROM and the normal flash EEPROM, which own one physical address with respect to one logic address.

Sixth Embodiment

Figure 16:
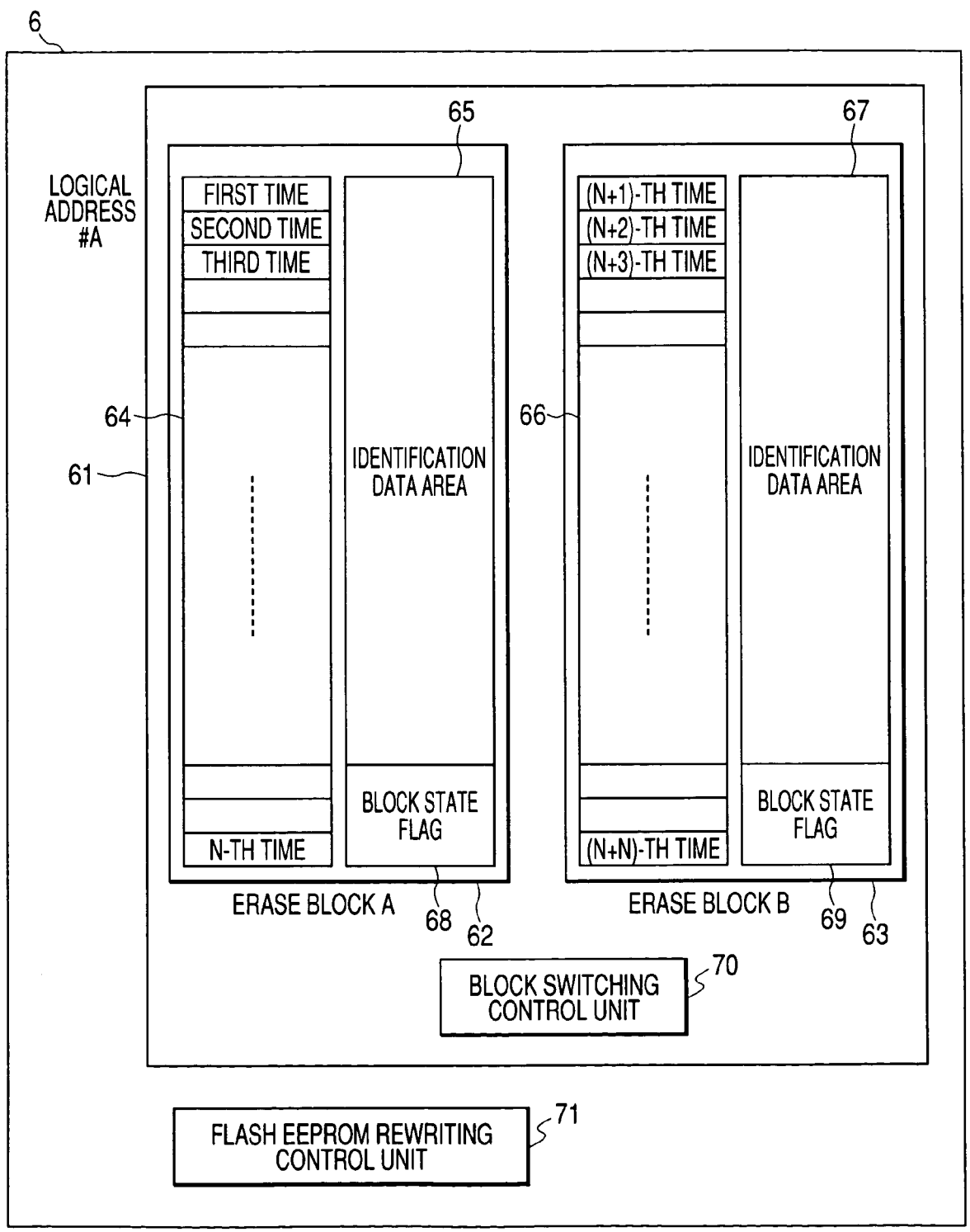
FIG. 16 is a block diagram for showing a structure of a semiconductor memory device according to a sixth embodiment of the present invention.
Figure 17:
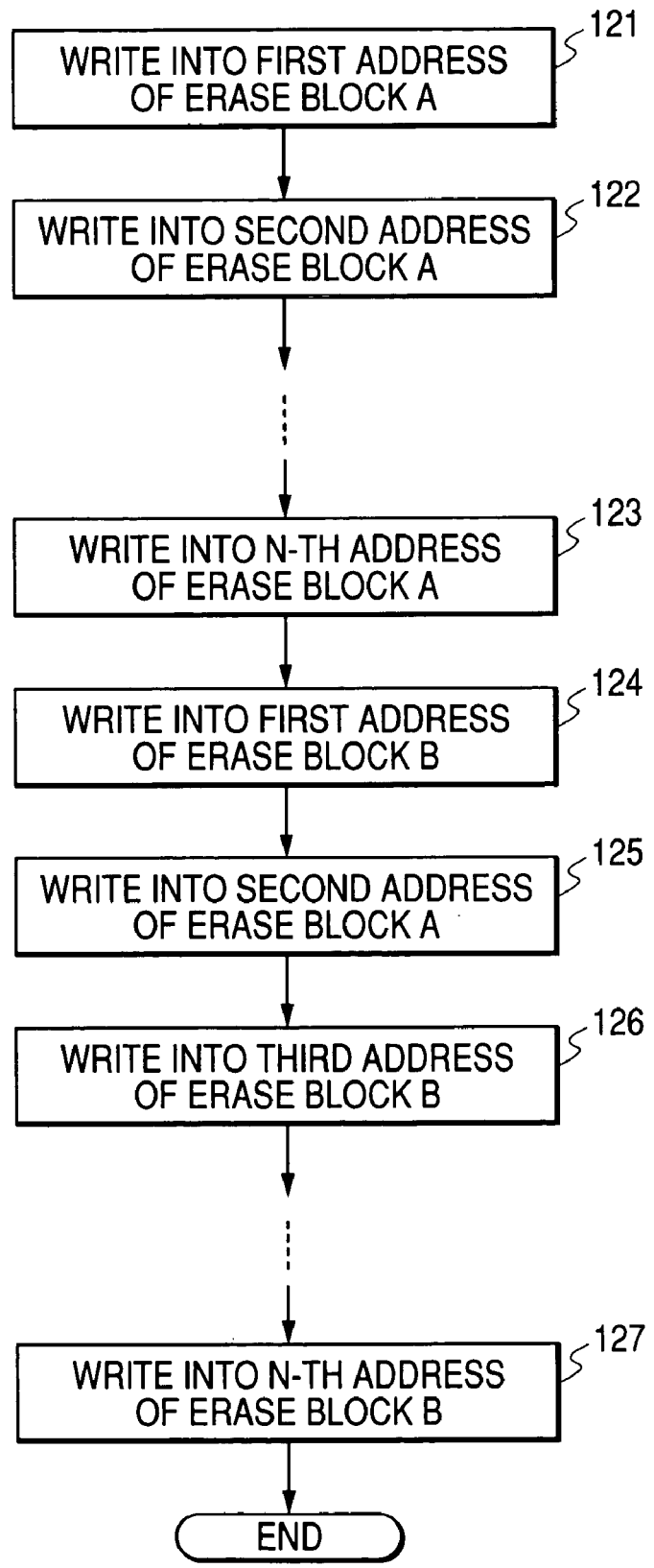
FIG. 17 is a flow chart for indicating flow operations of a writing operation in the sixth embodiment of the present invention.
Figure 18:
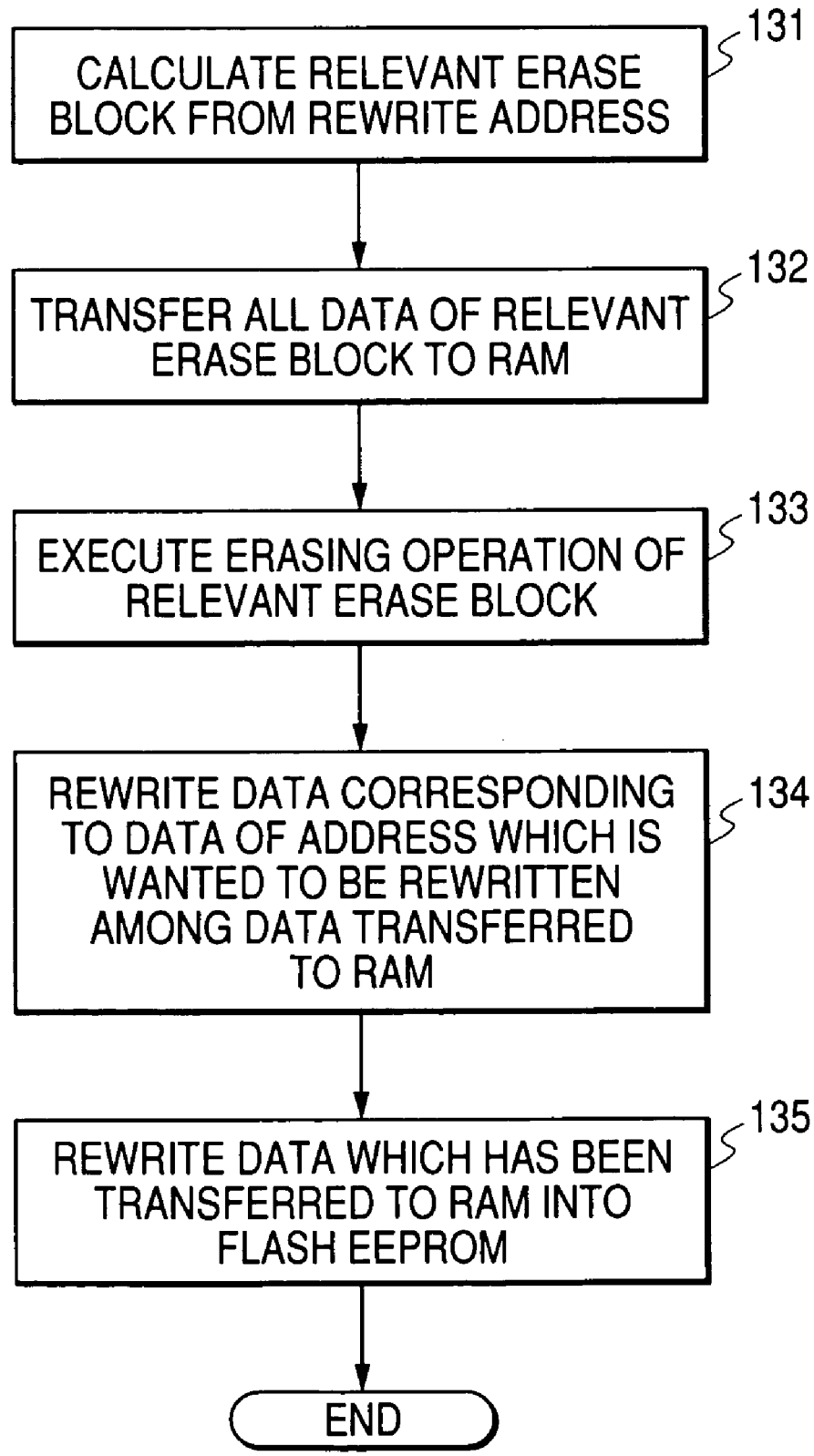
FIG. 18 is a flow chart for representing flow operations of the rewriting operations of the conventional non-volatile memory.

FIG. 16 is a block diagram for showing a structure of a semiconductor memory device according to a sixth embodiment of the present invention. Reference numeral 6 shows a non-volatile memory device (flash EEPROM), which can be erased in a batch manner in the unit of a block; reference numeral 62 represents a non-volatile memory which contains an aggregated member 64 made of a plurality of physical address memories #0, #1, - - -, #n corresponding to a write data area, a non-volatile memory 65 corresponding to an identification memory area, and a state flag 68 of an erase block "A" constructed of a non-volatile memory, which is arranged in this erase block "A". Also, reference numeral 63 shows a non-volatile memory which contains an aggregated member 66 made of a plurality of physical address memories #0, #1, - - -, #n corresponding to a write data area, a non-volatile memory 67 corresponding to an identification memory area, and a state flag 69 of an erase block "B" constructed of a non-volatile memory, which is arranged in this erase block "B." Also, reference numeral 70 indicates a block switching control unit for controlling as to any one of the non-volatile memory 62 and the non-volatile memory 63 with respect to one logic address #A; reference numeral 61 shows a non-volatile memory corresponding to one logical address, which contains the non-volatile memory 62, the non-volatile memory 63, and the block switching control unit 68; and reference numeral 71 represents a rewrite control unit for controlling erasing/writing operations of the non-volatile memory device 6. It should be noted that both the non-volatile memory 62 and the non-volatile memory 63 own the same functions as those of the above-described fifth embodiment.

Next, a description is made of operations of the semiconductor memory device according to this sixth embodiment. A data writing method for writing data into the non-volatile memory 61 corresponding to one logical address #A is explained. It is so assumed that such a data has been previously written to the state flag 68 of the erase block "A", and this data indicates that the block "A" is valid.

When a writing operation with respect to the logical address #A is executed, first of all, the block switching control unit 70 generates upper-grade addresses corresponding to erase blocks into which read valid data as to the state flag 68 of the erase block "A" and the state flag 69 of the erase block "B" have been written.

Under initial condition, since the erase block "A" has been valid, the upper-grade address is determined as a physical address corresponding to the erase block "A", the physical address of the erase block "A" is selected, and subsequently, a writing operation of data is carried out with respect to the non-volatile memory 62 in accordance with the above-described method of the fifth embodiment, so that the data can be rewritten up to "n" times (steps 121 to 123).

While such a condition that a result obtained by decoding a value of an identification data register when the data is rewritten at the n-th time becomes "#n" is used as a trigger, a value of the non-volatile memory contained in the block switching control unit 68 is written as a value for indicating that the block "B" is valid (steps 124 to 127).

When a data writing operation at an (n+1)-th time is executed, the block switching control unit 70 reads out both the state flag 68 of the erase block "A" and the state flag 69 of the erase block "B." In the case that the values for indicating "validation" have been written in both the state flags 68 and 69, the block switching control unit 70 selects such an erase block having a low priority degree (in this case, erase block "B"), and then, a physical address corresponding to the erase block "B" is selected.

As a result, data writing operations are subsequently carried out with respect to the non-volatile memory 63 in accordance with the above-explained method of the fifth embodiment until an (n+n)-th time. While the data writing operations are executed form the (n+1)-th time up to the (n+n)-th time, the rewrite control unit 71 erases the entire erase block "A" by using empty timing of the process operation.

When the data writing operation is performed at the (n+n)-th time, such a value for indicating that the erase block "A" is valid is written into the state flag 68 of the erase block "A" which has already been erased. When a data writing operation is carried out at an (n+n+1)-th time, the block switching control unit 70 selects the erase block "A", and then selects a physical address corresponding to the erase block "A."

As preciously explained, in accordance with this embodiment, since the data is sequentially written in this order from the erase block "A" via the erase blocks "B" and "A" to the erase block B, the data rewriting operations can be carried out plural times (=erasing times of flash EEPROM X n times), so that a total rewriting time with respect to the logical address #A can be largely increased.

It should be understood that the non-volatile memories 62 and 63 own the functions equivalent to those of the non-volatile memory explained in the fifth embodiment, but may alternatively own those of the no-volatile memories as explained in any of the first to fifth embodiments.

Also, the present invention is not limited only to the above-described embodiments, but may be realized by way of other various modes as to the concrete structures, functions, operations, and effects without departing from the technical scope and spirit of the present invention.

In accordance with the invention, since a plurality of physical address memories are allocated with respect to one logical address, when the content stored at one logical address is rewritten, the data is written into the empty memory among the plural physical address memories provided in correspondence thereto, so that the data can be rewritten with respect to one logical address without executing the erasing operation. As a result, the storage contents of the non-volatile memory can be rewritten, while the area of the semiconductor memory device is not increased. In addition, since the erasing operation is not required, the storage contents of the EPROM which cannot be electrically erased can be rewritten. Furthermore, the rewritable area in the small unit (word unit) can be provided in the batch-erasing type flash EEPROM.

In accordance with the invention, when the content stored at one logical address is read, since the content of the physical address memory which has been written at last is read, the valid data can be read while the erasing operation is not carried out during the writing operation.

In accordance with the invention recited in claim 3 and claim 5, since a plurality of physical address memories and a plurality of address identification areas are allocated with respect to one logical address, when the content stored at one logical address is rewritten, the empty memory among the plural physical address memories provided in correspondence thereto is searched based upon the address identification data of the address identification areas, and then, the data is written into this empty physical address memory, so that the data can be rewritten with respect to one logical address without executing the erasing operation. As a result, the storage contents of the no-volatile memory can be rewritten, while the area of the semiconductor memory device is not increased. In addition, since the address identification data is employed so as to retrieve the empty physical memory, the retrieve information as to the empty physical address memory need not be contained in the data which is stored in the physical address memory, and also, the data can be rewritten without providing the specific write limitation in the physical address memory.

In accordance with the invention, when the content stored at one logical address is read, the physical address memory into which the data has been written at last is searched based upon the address identification data, and the content of this searched physical address memory is read. As a result, even if the easing operation is not carried out during the writing operation, the valid data can be read.

In accordance with the invention, since a partial area of the plural physical address memories with respect to one logical address is set to the address identification data areas, another physical address memory need not be prepared in order to secure the address identification data areas, which can be avoid increasing of the area of the memory device.

In accordance with the invention, since a separate physical address is set in the address identification data areas with respect to the plural physical address memories with respect to one logical address, the rewritable area can be provided without changing the word length.

In accordance with the invention, since 1 bit is allocated as to 1 physical address as the address identification data areas, the rewritable area can be provided without producing the waste area by reducing the address identification data area.

In accordance with the invention, since the address identification data of the address identification data area is read into the volatile memory so as to be employed, the address decoding time required in the writing operation and the reading operation can be decreased to substantially negligible short time. While the same reading speed as the reading speed of the normal EPROM, or the normal EEPROM is maintained, the rewritable area can be provided. Furthermore, in an existing EEPROM, a word rewriting operation is defined by combining an erasing process operation with a writing process operation. To the contrary, in the semiconductor memory device of the present invention, since a rewriting operation is carried out only by a reading process operation and a writing process operation, rewriting time can be considerably shortened, as compared with that of the existing EEPROM.

In accordance with the invention, since the physical address memories are arranged in a plurality of different erase blocks and the following process operations are repeatedly carried out, a total rewriting number with respect to one logical address can be largely increased. In the process operations, when the data are written in all of the plural physical address memories within the first erase block, the data are subsequently written in the plural physical address memories within the second erase block, during which the data written in the first erase block is erased. Next, when the data are written in all of the plural physical address memories within the second erase block, the data are gain written in the plural physical address memories within the first erase block.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A semiconductor memory device comprising:

memory means for allocating a plurality of physical address memories and a plurality of address identification data areas with respect to one logical address;

write destination selecting means for selecting an empty physical address memory among said plurality of physical address memories based upon address identification data of said address identification data areas, said empty physical address memory corresponding to said one logical address;

writing means for writing data into said selected empty physical address memory, wherein said writing means writes new data while retaining the previous written data stored in a different physical address memory which corresponds to said one logical address;

read destination selecting means for selecting a physical address memory into which the data has been written at last among said plurality of physical address memories based upon the address identification data of said address identification data areas;

reading means for reading the data from said selected physical address memory into which the data has been written at last, wherein said read destination selecting means designates the address identification data areas provided in correspondence with the physical addresses with said one logical address in the address order so as to read address identification data, and selects an empty physical address memory based upon a read result generated by said reading means, and also, selects physical address memory having an address preceding to said selected empty physical address memory by 1 as the physical address memory into which the data has been written at last.

2. A semiconductor memory device comprising:

memory means for allocating a plurality of physical address memories and a plurality of address identification data areas with respect to one logical address;

write destination selecting means for selecting an empty physical address memory among said plurality of physical address memories based upon address identification data of said address identification data areas, said empty physical address memory corresponding to said one logical address; and writing means for writing data into said selected empty physical address memory, wherein said writing means writes new data while retaining the previous written data stored in a different physical address memory which corresponds to said one logical address, and a plurality of physical address memories with respect to one logical address which constitute said memory means are arranged at a plurality of different rewritable non-volatile memory erase blocks; and control means for identifying if all of said plurality of physical address memories can be written within a first erase block, and for deciding to write said plurality of physical address memories within a second erase block, during which said first erase block is erased.

* * * * *